United States Patent
Nakamura et al.

(10) Patent No.: US 6,586,794 B2
(45) Date of Patent: Jul. 1, 2003

(54) SEMICONDUCTOR DEVICE AND ITS MANUFACTURE

(75) Inventors: Shunji Nakamura, Kawasaki (JP); Akiyoshi Hatada, Kawasaki (JP); Yoshiaki Fukuzumi, Yokohama (JP)

(73) Assignees: Fujitsu Limited, Kawasaki (JP); Kabushiki Kaisha Toshiba, Kawasaki (JP)

( * ) Notice: Subject to any disclaimer, the term of this patent is extended or adjusted under 35 U.S.C. 154(b) by 20 days.

(21) Appl. No.: 09/808,188

(22) Filed: Mar. 15, 2001

(65) Prior Publication Data

US 2001/0028077 A1 Oct. 11, 2001

(30) Foreign Application Priority Data

Apr. 6, 2000 (JP) .......................................... 2000-104361

(51) Int. Cl.$^7$ ............................................ H01L 27/108
(52) U.S. Cl. ........................ 257/296; 257/238; 257/241; 257/253
(58) Field of Search ................................ 438/238, 241, 438/253, 396, 397, 622, 666, 791

(56) References Cited

U.S. PATENT DOCUMENTS 6,258,649 B1 * 7/2001 Nakamura et al. .......... 438/238
6,323,100 B1 * 11/2001 Kimura ..................... 438/397

FOREIGN PATENT DOCUMENTS

| JP | 08-330539 | 12/1996 |
| JP | 10-284700 | 10/1998 |
| JP | 11-017144 | 1/1999 |

* cited by examiner

Primary Examiner—David Nelms
Assistant Examiner—Mai-Huong Tran
(74) Attorney, Agent, or Firm—Armstrong, Westerman & Hattori, LLP

(57) ABSTRACT

A semiconductor device having: a substrate having a first area and a second area surrounding the first area; an insulating film formed in the second area; electrodes formed above the surface of the substrate in the first area; dielectric films formed above the electrodes; and an opposing electrode formed above the dielectric films, wherein the shape of a side wall of the insulating film includes a shape reflecting the outer peripheral shape of a side wall of the electrode facing the side wall of the insulating film. The semiconductor device of high integration, low cost and high reliability can be realized.

14 Claims, 26 Drawing Sheets

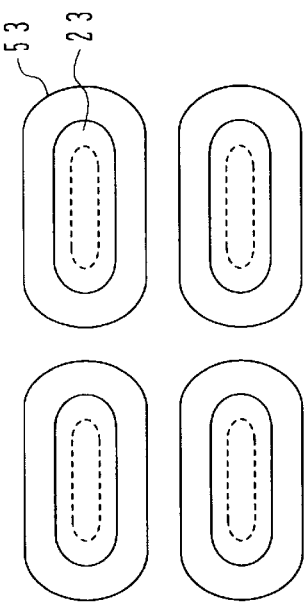
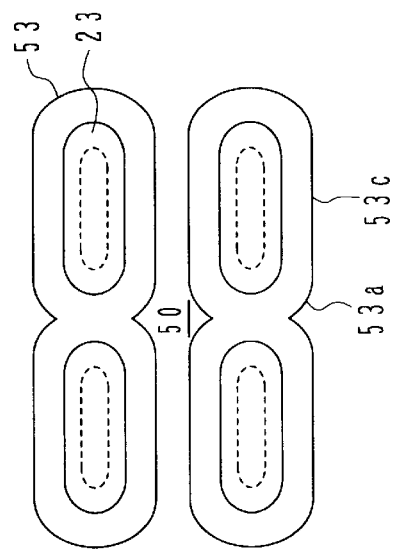
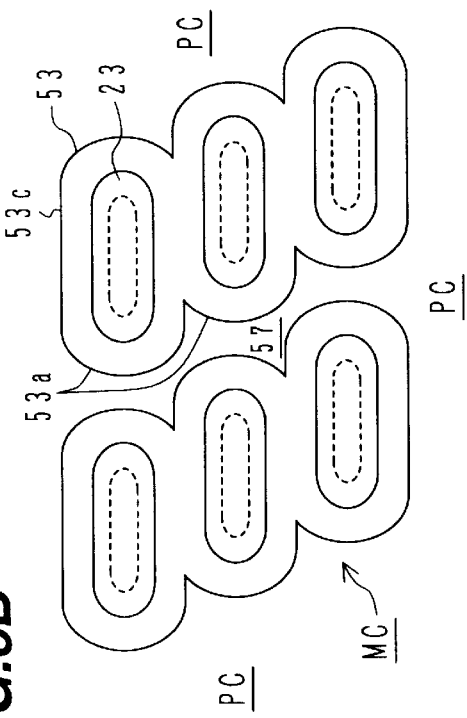
FIG.6A  FIG.6B  FIG.6C  FIG.6D

SEMICONDUCTOR DEVICE AND ITS MANUFACTURE

This application is based on Japanese Patent Application 2000-104361, filed on Apr. 6, 2000, the entire contents of which are incorporated herein by reference.

BACKGROUND OF THE INVENTION a) Field of the Invention

The present invention relates to a semiconductor device and its manufacture, and more particularly to a semiconductor device having capacitors and a semiconductor device manufacture method.

b) Description of the Related Art

A dynamic random access memory (hereinafter called "DRAM") is generally constituted of one transistor and one capacitor per one memory cell. In order to increase a memory capacity, it is necessary to form memory cells as many as possible in a limited memory cell array area.

In a DRAM memory cell array, word lines also used as gate electrodes of memory cell transistors and bit lines for charging and discharging capacitors are disposed crossing each other.

Each capacitor is constituted of a storage electrode connected to a transistor, a capacitor dielectric film and a cell plate electrode opposing the storage electrode.

As a technique of improving the integration degree of DRAM, a capacitor over bit line structure is known in which after word lines and bit lines are formed on a semiconductor substrate, capacitors are formed over these lines. The capacitor storage electrode is required to be connected to one of drain and source regions of a memory cell transistor. In order to reliably form a contact hole through an insulating film, a self aligned contact (hereinafter called SAC) structure has been adopted.

With this SAC structure, the upper surface and side walls of a word line of a memory cell transistor are covered with, for example, a silicon nitride film. Since the silicon nitride film functions as an etch stopper while a contact hole is formed through an insulating film, even if the position of the contact hole is displaced to some extent, the source/drain region can be exposed reliably. During this etching, the word line also functioning as the gate electrode can be insulated and electrically protected by the silicon nitride film.

The SAC structure is also applied to the case wherein after the word line is buried in the insulating film, a bit line is formed on the surface of the insulating film. The upper surface and side walls of the bit line are covered with a silicon nitride film so that a contact hole can be formed reliably exposing a contact area while the bit line is insulated and electrically protected by the silicon nitride film.

Further improvement on the integration degree of DRAM and further reduction of the manufacture cost of DRAM are desired. In order to reliably manufacture a high integration DRAM, it is desired to simplify the manufacture processes.

SUMMARY OF THE INVENTION

It is an object of the present invention to provide manufacture processes for semiconductor devices of high integration, low cost and high reliability.

It is another object of the present invention to provide semiconductor devices of high integration, low cost and high reliability.

According to one aspect of the present invention, there is provided a capacitor comprising: a substrate having a first area and a second area surrounding said first area; an insulating film formed in said second area; an electrode formed above a surface of said substrate in said first area; a dielectric film formed on said electrode; and an opposing electrode formed on said dielectric film, wherein a shape of a side wall of said insulating film includes a shape reflecting an outer peripheral shape of a side wall of said electrode facing the side wall of said insulating film.

According to another aspect of the present invention, there is provided a semiconductor device comprising: a semiconductor substrate having a first area and a second area surrounding said first area; a first insulating film formed above said semiconductor substrate; a contact hole formed through said first insulating film in said first area; a second insulating film formed above said first insulating film in said second area; an electrode electrically connected to said semiconductor substrate via said contact hole; a dielectric film formed on said electrodes; and an opposing electrode formed on said dielectric film, wherein a shape of a side wall of said second insulating film includes a shape reflecting an outer peripheral shape of a side wall of said electrode facing the side wall of said second insulating film.

According to another aspect of the present invention, there is provided a method of manufacturing a semiconductor device, comprising the steps of: (a) forming a first insulating film above a semiconductor substrate having a first area and a second area surrounding said first area;(b) forming a first contact hole through said first insulating film in said first area, said first contact hole reaching said semiconductor substrate;(c) forming a second insulating film above said first insulating film;(d) forming a second contact hole through said second insulating film in said first area, said second contact hole reaching said first contact hole;(e) forming an electrode electrically connected to said semiconductor substrate in said second contact hole;(f) performing an etching process to expose a side wall of the electrode and reflect an outer peripheral shape of the side wall of said electrode upon an outer peripheral shape of a side wall of said second insulating film left in said second area surrounding said first area;(g) forming a dielectric film covering an exposed surface of said electrode; and (h) forming an opposing electrode on said dielectric films.

As above, the storage electrode having a bath tub shape can be formed without using a mask. The number of manufacture processes for semiconductor devices such as DRAM can be reduced. The manufacture cost of semiconductor devices can be reduced greatly.

In DRAM manufacture processes, the boundary between the memory cell area and peripheral circuit area can be defined in a self alignment manner without using a mask. It is unnecessary to consider an alignment margin. An additional area for providing a margin of the boundary between the memory cell area and peripheral circuit area is not necessary so that the integration degree of semiconductor integrated circuits can be improved. The boundary area between the memory cell area and peripheral circuit area can be reduced to a minimum necessary area. Since an additional area is not necessary, the integration degree can be improved.

BRIEF DESCRIPTION OF THE DRAWINGS

FIGS. 6A to 6D are schematic plan views showing a variety of characteristic patterns of the semiconductor device of the first embodiment.

DETAILED DESCRIPTION OF THE PREFERRED EMBODIMENTS

First, experimental studies made by the present inventor will be described with reference to FIGS. 1A to 1F and FIG. 2.

FIGS. 1A to 1F are schematic cross sectional views of a semiconductor substrate illustrating DRAM manufacture processes. FIG. 2 is a schematic plan view of DRAM.

Figure 1A:
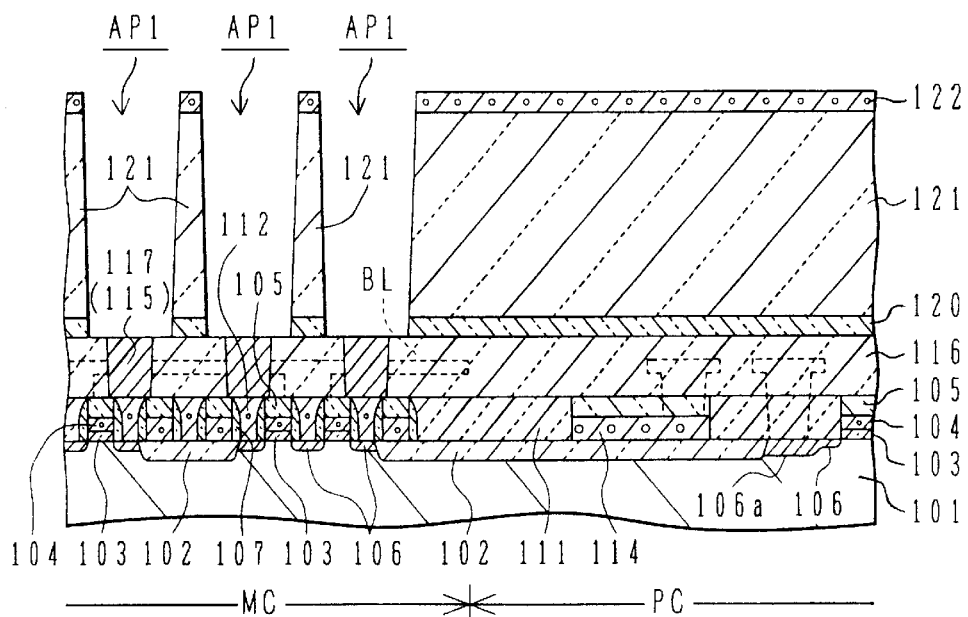
FIGS. 1A to 1F are schematic cross sectional views of a semiconductor substrate illustrating DRAM manufacture processes.
Figure 2:
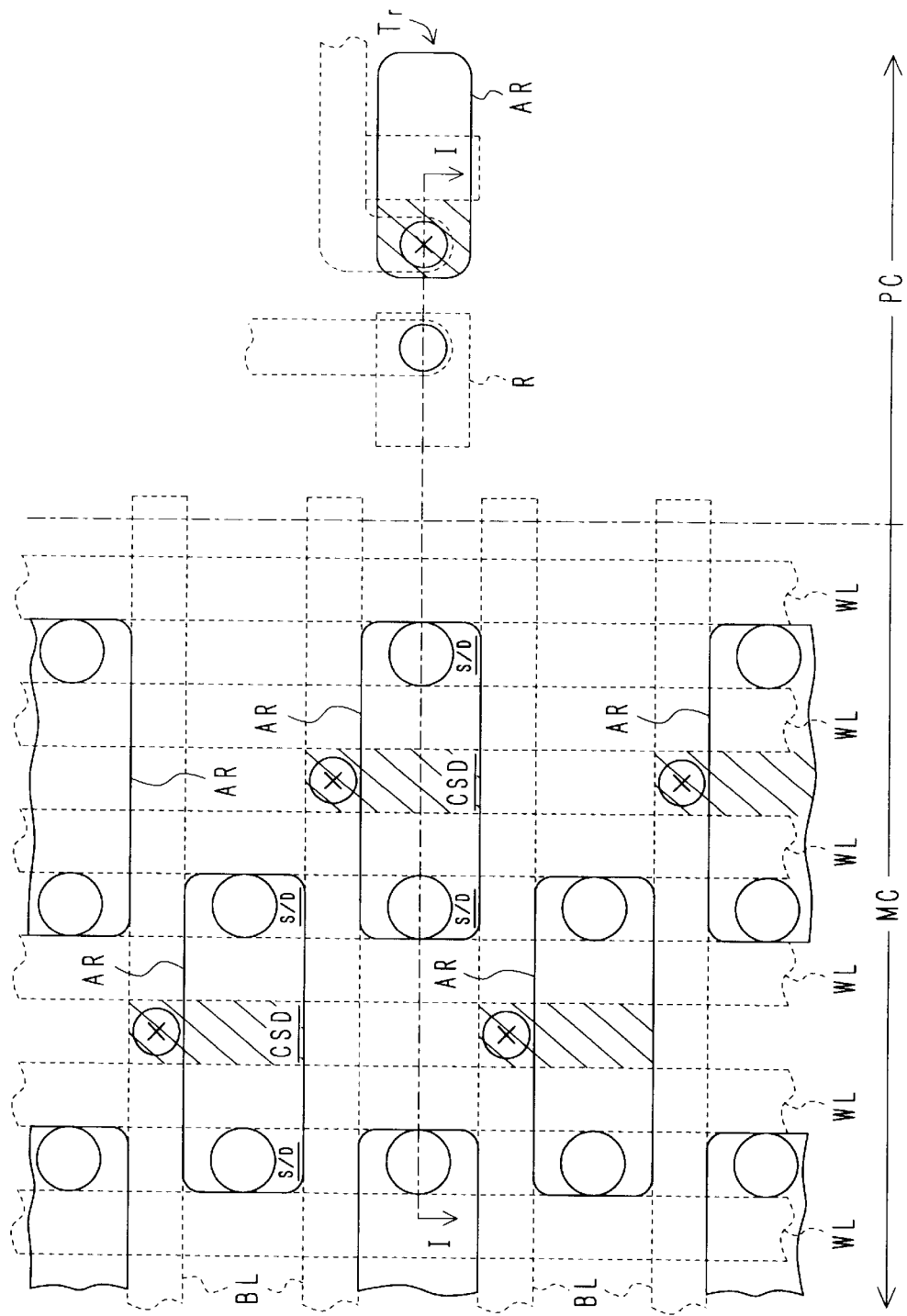
FIG. 2 is a schematic plan view of DRAM.

As shown in FIG. 1A, DRAM has a memory cell area MC in which memory cells are formed and a peripheral circuit area PC in which peripheral circuits are formed.

On the surface of a semiconductor substrate 101 having a p-type surface region, an element isolation silicon oxide film 102 is formed by shallow trench isolation (STI) techniques.

The silicon oxide film 102 defines a plurality of active regions in the surface layer of the semiconductor substrate.

A gate oxide film 103 is formed on the surface of the semiconductor substrate in each active region. On this gate oxide film 103, a gate electrode (word line) 104 is formed by using polysilicon, polycide, metal or the like.

The upper surface of the gate electrode is covered with a silicon nitride layer 105. The silicon nitride layer 105 and gate electrode 104 are formed by patterning at the same time and have the same shape.

By using the silicon nitride layer 105 and gate electrode 104 as a mask, n-type impurity ions are implanted into the surface layer of the semiconductor substrate 101 to form low impurity concentration source/drain regions 106. Different ion implantation processes may be performed for n-channel transistors in the memory cell area MC and peripheral circuit area PC by using masks.

Thereafter, silicon nitride is deposited over the whole surface of the semiconductor substrate and anisotropic etching is performed to leave side spacers 107 of silicon nitride only on the side walls of the gate electrode structure.

The surface of the gate electrode 104 is therefore covered with the silicon nitride layers including the silicon nitride layer 105 on the upper surface of the gate electrode 104 and the side spacers 107.

If necessary, after the side spacers 107 are formed, high concentration source/drain regions 106a of the transistors in the peripheral circuit area PC may be formed through ion implantation at a high concentration and a hi acceleration energy, to form transistors having a lightly doped drain (LDD) structure.

An insulating layer 111 of silicon oxide or the like is formed on the surface of the semiconductor substrate. A resist pattern is formed on the surface of the insulating layer 111. This insulating layer 111 is etched to form a contact hole reaching a desired source/drain region. In this case, the silicon nitride layers 105 and 107 on the upper surface and side walls of the gate electrode function as an etch stopper so that the contact hole can be formed in a self alignment manner.

A conductive layer 112 of polysilicon or the like is deposited burying the contact hole. The conductive layer at a level higher than the insulating layer 111 is removed by chemical mechanical polishing (CMP) or the like. The flat surface of the insulating layer 111 is therefore formed, with the polysilicon 112 or the like being filled in the contact hole. In FIG. 1A, the gate electrodes 104 juxtaposed in the memory cell area MC are used also as the word lines (WL) in the memory cell area. The transistors formed in the peripheral circuit area PC are used for peripheral circuits. After another insulating layer is deposited on the insulating layer 111, bit lines BL indicated by a broken line in FIG. 1A are formed. Another insulating layer is deposited. The bit line is therefore buried in an insulating layer 116.

FIG. 2 shows an example of the layout of active regions AR, word lines WL and bit lines BL, respectively in the memory cell area MC. Each active region is long in the lateral direction, and has source/drain regions S/D in opposite areas to which storage capacitors are connected. In the middle area of the active region, a common source/drain region CSD is formed connected to the bit line BL. In an area of these two types of source/drain regions S/D, a word line WL is disposed extending in the vertical direction in FIG. 2. Namely, two memory transistors are formed in one active region AR, and the bit line BL indicated by a broken line is connected to the middle common source/drain region CSD. Bit lines BL and word lines WL are disposed crossing each other on the surface of the semiconductor substrate. A plug for the bit line BL is formed in a hatched area. Memory cell capacitors are formed on laterally opposite sides of each active region AR. In FIG. 2, the capacitor is indicated by a circle symbol.

The peripheral circuit area PC is formed surrounding the outer periphery of the memory cell area MC. A number of elements such as transistors and resistors are formed in the peripheral circuit area PC to form peripheral circuits. FIGS. 1A to 1F correspond to cross sectional views taken along line I—I shown in FIG. 2. In order to clarify the structure of the bit line BL, the bit line is shown in FIGS. 1A to 1F not by a cross sectional view but by a transparent view.

Reverting to FIG. 1A, bit line contact holes are formed through the insulating layer 111 and an insulating layer 116 to form bit lines BL and contact pads (peripheral circuit area).

Other contact holes are also formed through the insulating layer 116. Conductive material such as W is filled in this contact hole. After the conductive material is deposited, the conductive material at a level higher than the surface of the insulating layer 116 is removed to form a flat surface of the insulating layer 116 with a buried conduction plug 117. A silicon nitride film 120 as an etch stopper is formed over the planarized whole surface of the insulating layer 116.

Next, an insulating layer 121 of silicon oxide or the like is deposited thick by CVD using tetraetoxysilane (TEOS).

The insulating layer 121 is preferably deposited to a thickness of, for example, from 0.3 μm to 1.5 μm. An amorphous silicon layer 122 is deposited as a hard mask on the insulating layer 121, to a thickness of, for example, about 50 nm. A photoresist mask is formed on the amorphous silicon layer 122 by photolithography, and the amorphous silicon layer 122, insulating layer 121 and silicon nitride film 120 are sequentially etched and removed to form openings AP1 exposing the surfaces of the conductive plugs 117. The slope angle of the insulating layer defining the inner wall of the opening is, for example, from 88 degrees to 90 degrees. The slope angle of 88 degrees corresponds to the state that the diameter of the opening gradually increases toward the upper surface of the substrate.

Figure 1B:
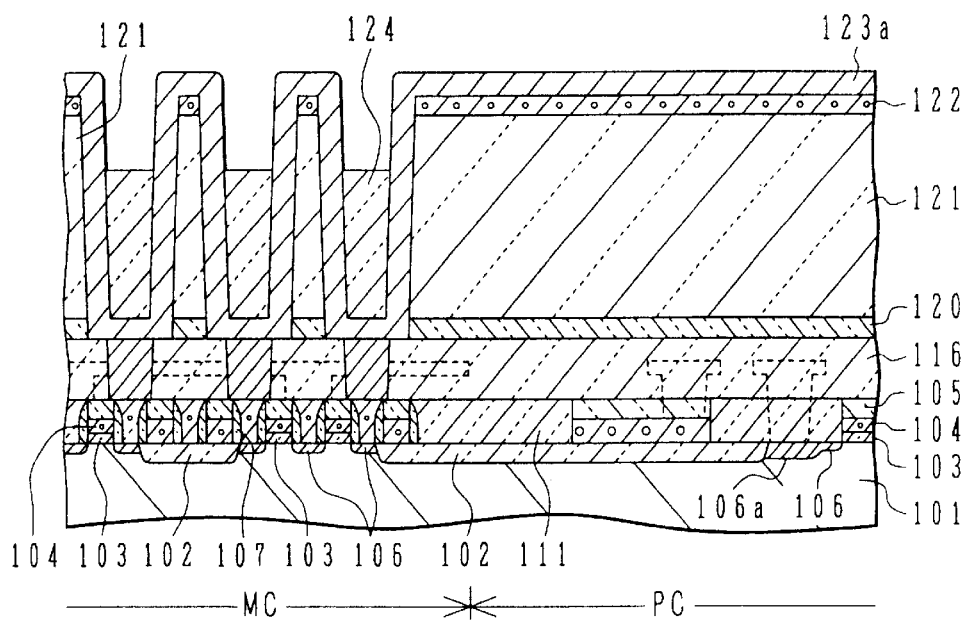

As shown in FIG. 1B, storage electrode material 123a is deposited over the whole substrate surface. Next, on the storage electrode material 123a, an inner protective film 124 of, for example, SOG oxide, is formed. The inner protective film 124 is about 200 nm thick. The inner protective film 124 internally protects the thin storage electrode material 123a.

Next, the inner protective film 124 is anisotropically etched to depress it lower in the opening AP1.

Next, the storage electrode material 123a is etched to remove the material exposed on the surface and side walls of the insulating layer 121.

Figure 1C:
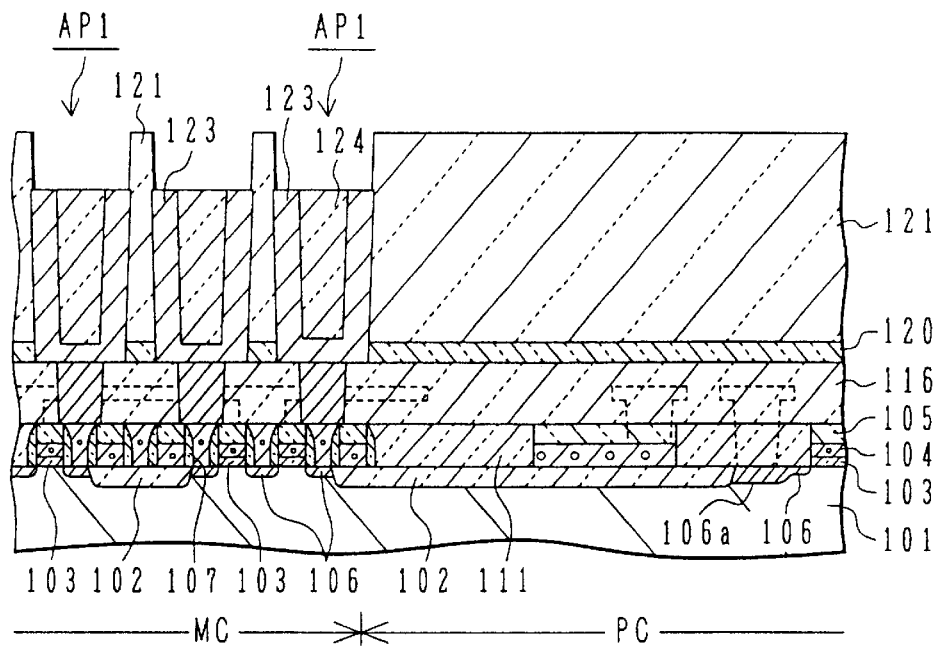

As shown in FIG. 1C, the storage electrode material 123a is etched to the upper surface of the depressed inner protective film 124. A storage electrode 123 is therefore formed which is separated at each opening AP1.

Figure 1D:
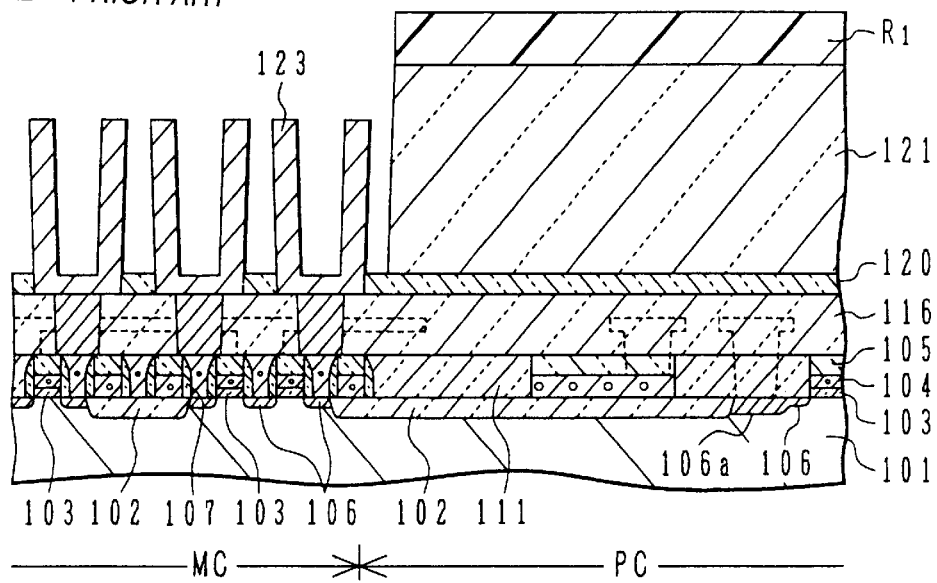

Next, as shown in FIG. 1D, the inner protective film 124 formed on the storage electrode 123 and the insulating layer 121 between the storage electrodes 123 are etched and removed. For this etching, anisotropical etching by reactive ion etching is performed at an initial stage and then wet etching is performed.

During this etching, in order to prevent the insulating layer 121 in the peripheral circuit area PC from being etched, it is necessary to form a photoresist mask RI on the insulating layer 121 in the peripheral circuit area PC by photolithography.

Figure 1E:
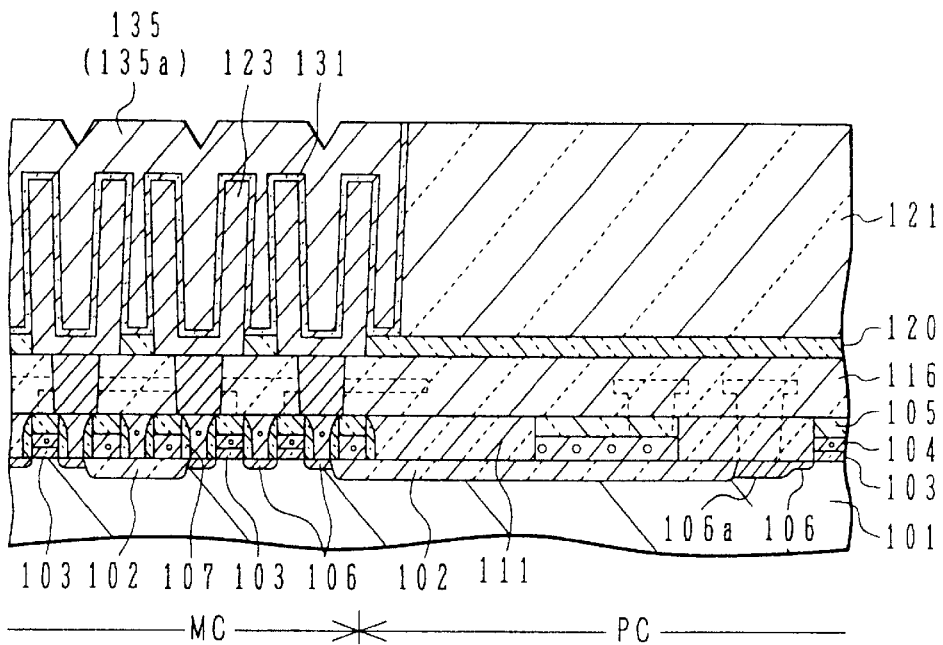

Next, as shown in FIG. 1E, a capacitor dielectric film 131 is deposited over the whole substrate surface. On the capacitor dielectric film 131, a conductive layer 135a is deposited by CVD. the surface of the conductive layer 135a is planarized by CMP by using the surface of the insulating layer 121 in the peripheral circuit area PC as a stopper. As this planarizing process, an etch-back method may be used. In this manner, a cell plate electrode 135 is formed.

The cell plate electrode 135 in the memory cell area MC is approximately flush with the surface of the insulating layer 121 in the peripheral circuit area PC.

Figure 1F:
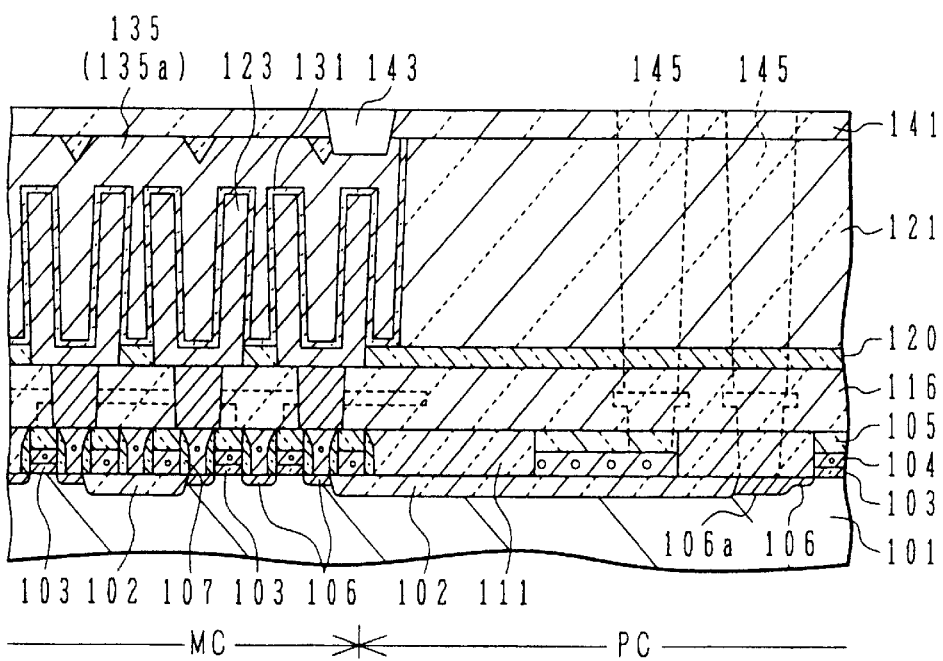

As shown in FIG. 1F, an insulating film 141 is formed over the whole surface of the substrate, covering the cell plate electrode 135. Thereafter, a contact hole 143 is formed above the cell plate electrode 135 and a contact hole 145 is formed above each transistor in the peripheral circuit area PC. The contact holes 143 and 145 are filled with conductive material, and an upper level wiring layer is formed.

In the above manufacture processes, during etching of the inner protective film 124 on the storage electrode 123 and the insulating film 121 between the storage electrodes 123, in order to prevent the insulating layer 121 in the peripheral circuit area PC from being etched, it is necessary to form the photoresist mask R1 on the insulating layer 121 in the peripheral circuit area PC by photolithography.

If this photolithography process can be omitted, the number of processes can be reduced and a manufacture yield of DRAM can be expected to be improved.

The inventor has devised a new process dispensing with this photolithography process.

Figure 3:
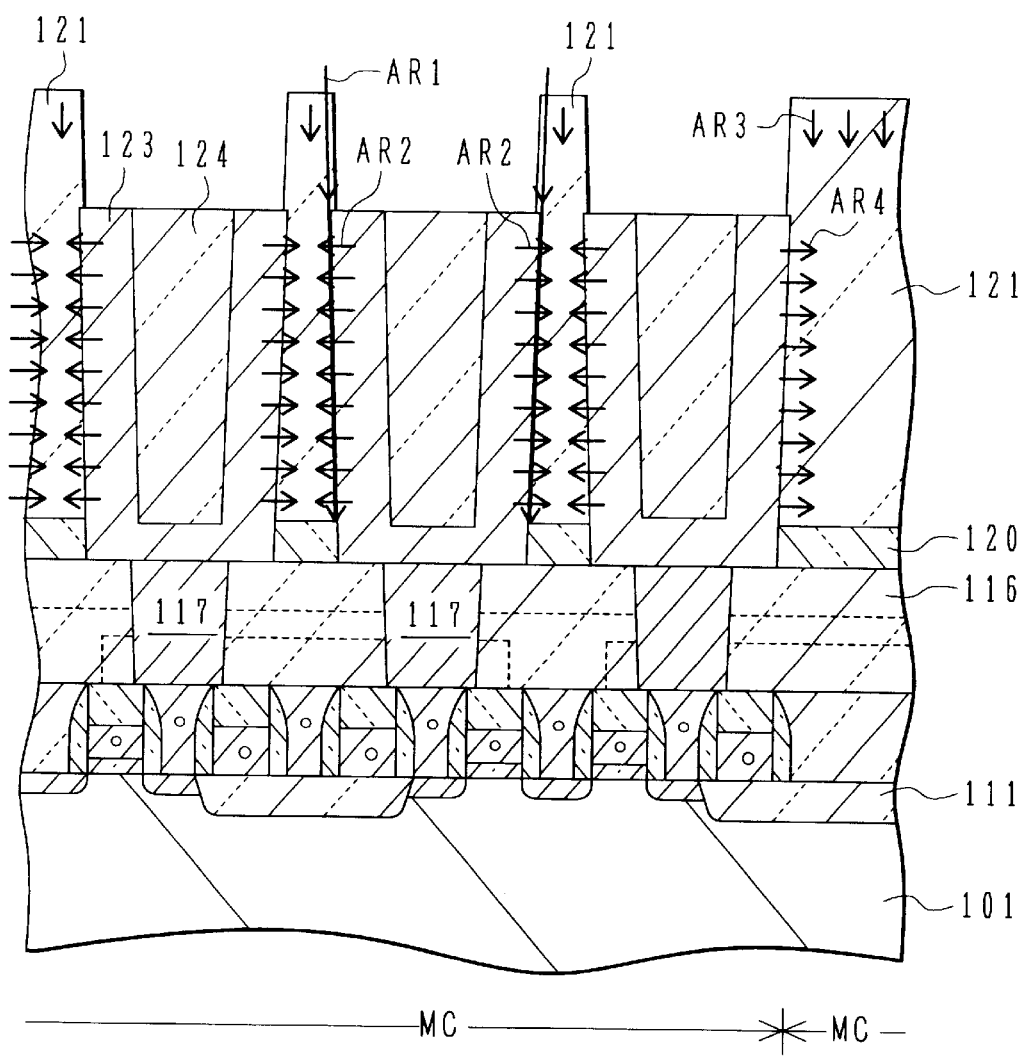
FIG. 3 is a schematic cross sectional view of a semiconductor substrate illustrating the principle of a semiconductor device manufacture method according to a first embodiment of the invention.

FIG. 3 is a cross sectional view illustrating the new process devised by the inventor and corresponding to the processes shown in FIGS. 1C and 1D. The photoresist mask RI on the insulating layer 121 in the peripheral circuit area PC shown in FIG. 1D is not used.

Under the condition that the upper surface of the storage electrode 123 is depressed lower than the upper surface of the insulating film 121, the inner protective film 124 and insulating layer 121 are etched. This etching is usually wet etching using hydrofluoric acid based solution. The inner protective film 124 is made of SOG. The etching rate of SOG is very fast if hydrofluoric acid base etching solution is used.

The etching characteristics of the insulating layer 121 near at the interface between the storage electrode 123 and insulating layer 121 are set different from the etching characteristics of the insulating layer 121 in an inner region (bulk region) away from the interface. By properly setting the etching solution, the insulating layer near at the interface between the storage electrode 123 and insulating layer 121 can be etched and removed faster.

At the initial stage, the etching progresses along the interface between the storage electrode 123 and insulating layer 121 toward the substrate bottom (indicated by an arrow AR1). After a slit is formed at the interface, the etching progresses along a direction perpendicular to the interface between the storage electrode 123 and insulating layer 121 (indicated by an arrow AR2).

Etching was performed by using hydrofluoric acid based etching solution. The etching rate of the insulating film 121 near at the interface between the storage electrode 123 and insulating layer 121 was faster by one digit than that of the bulk region of the insulating layer 121. The etching first progressed along the interface and then progressed isotropically also in the lateral direction.

As the insulating layer 121 near at the interface between the storage electrode 123 and insulating layer 121 is etched and the insulating layer 121 is separated once from the storage electrode 123, the insulating layer 121 between the storage electrodes 123 can be etched faster. The insulating layer 121 between the two storage electrodes 123 is etched from the two interfaces and removed. By etching and removing the insulating layer by a thickness equal to a half of the space between the storage electrodes, the insulating layer between the storage electrodes can be removed completely. For example, in DRAM manufactured by the 0.15 to 0.13 µm rule, the space between two storage electrodes is about 0.1 µm. Therefore, the etching is set to remove the insulating film at least by about 0.05 µm. By considering a variation of an etch amount, it is preferable to etch the insulating layer by about 0.1 µm.

The insulating layer in an area other than the memory cell area MC, e.g., the insulating layer 121 on the upper surface of the peripheral circuit area PC, is etched from the upper surface toward the substrate bottom (indicated by an arrow AR3). Although this insulating layer 121 is etched from the upper surface by about 0.1 µm, this poses no problem if the insulating layer is made thicker by this etch amount In the region near at the interface between the memory cell area MC and peripheral circuit area PC, etching progresses in a direction parallel to the substrate surface toward the bulk region of the insulating layer in the peripheral circuit area PC. This etch amount is set to about 0.1 µm so that no practical problem occurs. If this process can be realized, the photolithography process of forming a photoresist mask covering the peripheral circuit area PC can be dispensed with.

The inventor has found the following three approaches to realizing the above-described process.

a) First approach: A combination of materials of the storage electrode and insulating layer is selected which shows a weak adhesion at the interface therebetween. If the interface has a weak adhesion, wet etching solution permeate first along the interface and the etching of the insulating layer near at the interface progresses rapidly.

b) Second approach: After the storage electrode is formed in the opening of the insulating layer, a heat treatment or the like is performed. With this process, some materials constituting the storage electrode diffuse into the insulating layer near at the interface between the storage electrode and insulating layer. Since metal materials are diffused into the insulating layer near at the interface, the wet etching rate becomes fast.

c) Third approach: A thin separation film is formed on the side walls of the insulating layer before the material of the storage electrode is deposited on the insulating layer. This thin separation film has an etch rate faster than that of the insulating layer and storage electrode, if predetermined wet etching is used. As the storage electrode material deposited on the upper surface of the insulating layer is etched, the upper end surface of the separation film is exposed. The separation film is selectively removed by the etching process capable of etching the separation film selectively or very fast. As the separation film is removed, a slit is formed at the interface between the storage electrode and insulating layer. Etching solution enters this slit and etches the insulating layer.

Any one of the first to third approaches or a combination thereof may be selectively used.

A semiconductor device and its manufacture method according to the first embodiment of the invention will be described with reference to the accompanying drawings.

Figure 4A:
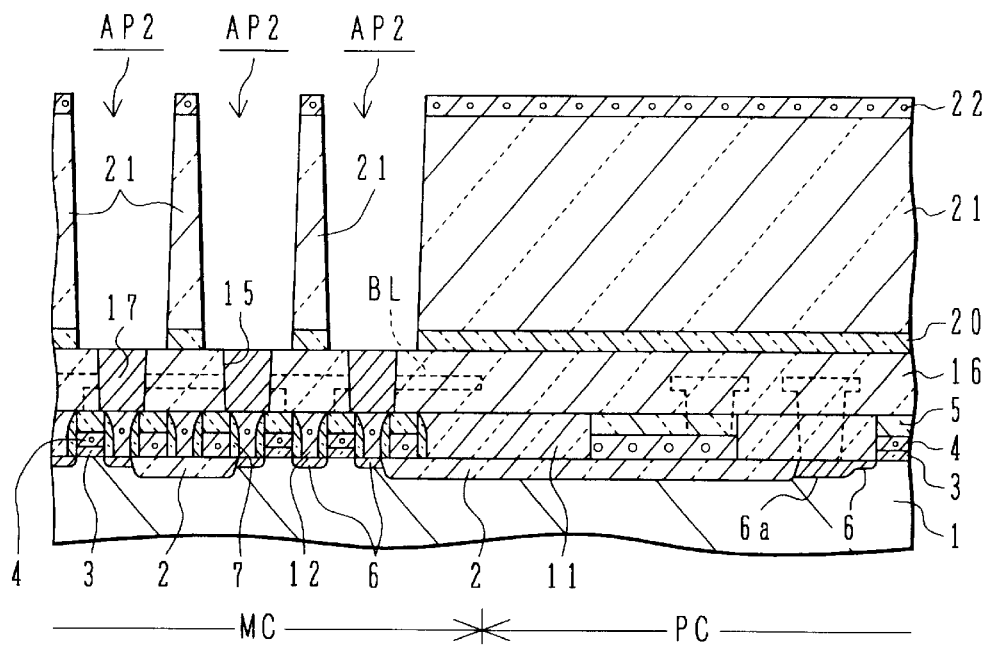
FIGS. 4A to 4F are schematic cross sectional views of a semiconductor substrate illustrating semiconductor device manufacture processes according to the first embodiment of the invention.

As shown in FIG. 4A, DRAM has a memory cell area MC in which memory cells are formed and a peripheral circuit area PC in which peripheral circuits are formed.

On the surface of a semiconductor substrate 1 having a p-type surface region, an element isolation silicon oxide film 2 is formed by STI techniques.

The silicon oxide film 2 defines a plurality of active regions in the surface layer of the semiconductor substrate.

A gate oxide film 3 is formed on the surface of the semiconductor substrate in each active region. On this gate oxide film 3, a gate electrode (word line) 4 is formed by using polysilicon, polycide, metal or the like.

The upper surface of the gate electrode 4 is covered with a silicon nitride layer 5. The silicon nitride layer 5 and gate electrodes are formed by patterning at the same time and have the same shape.

By using the silicon nitride layer 5 and gate electrode 4 as a mask, n-type impurity ions are implanted into the surface layer of the semiconductor substrate 1 to form low impurity concentration source/drain regions 6. Thereafter, silicon nitride is deposited over the whole surface of the semiconductor substrate and anisotropic etching is performed to leave side spacers 7 of silicon nitride only on the side walls of the gate electrode structure.

If necessary, after the side spacers 7 are formed, high concentration source/drain regions 6a of the transistors in the peripheral circuit area PC may be formed through ion implantation at a high concentration and a high acceleration energy, to form transistors having an LDD structure.

If CMOS transistors are to be formed in the peripheral circuit area PC, ion implantation for forming an n-type region and ion implantation for forming a p-type region are performed.

An insulating layer 11 of silicon oxide or the like is formed on the surface of the semiconductor substrate. A resist pattern is formed on the surface of the insulating layer 11. This insulating layer 11 is etched to form a contact hole reaching a desired source/drain region. In this case, the silicon nitride layers 5 and 7 on the upper surface and side walls of the gate electrode function as an etch stopper so that the contact hole can be formed in a self alignment manner.

A conductive layer 12 of polysilicon or the like is deposited burying the contact hole. The conductive layer at a level higher than the insulating layer 11 is removed by CMP or the like. The flat surface of the insulating layer 11 is therefore formed, with the polysilicon 12 or the like being filled in the contact hole.

In FIG. 4A, the gate electrodes 4 juxtaposed in the memory cell area MC are used also as the word lines (WL) in the memory cell area. The transistors formed in the peripheral circuit area PC are used for peripheral circuits. After another insulating layer 16 is deposited on the insulating layer 11, a bit line BL indicated by a broken line in FIG. 4A is formed. Another insulating layer is deposited. The bit line is therefore buried in an insulating layer 16.

FIG. 2 shows an example of the layout of active regions AR, word lines WL and bit lines BL, respectively in the memory cell area MC. Each active region is long in the lateral direction, and has source/drain regions S/D in opposite areas to which storage capacitors are connected. In the middle area of the active region, a common source/drain region CSD is formed connected to the bit line BL. In an area of these two types of source/drain regions S/D, a word line WL is disposed extending in the vertical direction in FIG. 2. Namely, two memory transistors are formed in one active region AR, and the bit line BL indicated by a broken line is connected to the middle common source/drain region CSD. Bit lines BL and word lines WL are disposed crossing each other on the surface of the semiconductor substrate.

Reverting to FIG. 4A, on the insulating layer 11, an inter-level insulating film (a portion of the insulating layer 16) is formed and a bit line contact hole and a bit line BL are formed. Thereafter, another insulating film (a portion of the inter-level insulating layer 16) is formed.

Other contact holes 15 are also formed through the insulating layer 16. Conductive material such as W is filled in this contact hole 15. After the conductive material is deposited, the conductive material at a level higher than the surface of the insulating layer 16 is removed to form a flat surface of the insulating layer 16 with a buried conductive plug 17.

In the above-described three approaches, as etching progresses along the interface, etching solution may permeate the lower-level structure and etch this structure.

Further, after the insulating layer surrounding the outer surface of the storage electrode is removed, the storage electrode is supported only by the lower-level structure (plug) with an adhesive force to the bottom surface of the storage electrode. The storage electrode is therefore likely to fall.

In order to prevent etching from progressing toward the lower-level structure, a silicon nitride film 20 as an etch stopper is formed over the planarized whole surface of the insulating layer 16.

The lower part of the storage electrode can be accommodated in an opening formed through the silicon nitride film 20 which has good adhesion to the storage electrode. The lower part of the storage electrode is supported by the surrounding silicon nitride film so that the storage electrode is hard to fall.

Next, an insulating layer 21 of silicon oxide or the like is deposited thick by CVD using tetraetoxysilane (TEOS).

The insulating layer is preferably deposited to a thickness of, for example, from 0.3 $\mu$m to 1.5 $\mu$m. An amorphous silicon layer 22 is deposited as a hard mask on the insulating layer 21, to a thickness of, for example, about 50 nm. A photoresist mask is formed on the amorphous silicon layer 22 by photolithography, and the amorphous silicon layer 22, insulating layer 21 and silicon nitride film 20 are sequentially etched and removed to form openings AP2 exposing the surfaces of the conductive plugs 17. The slope angle of the insulating layer 21 defining the inner wall of the opening is, for example, from 88 degrees to 90 degrees. The slope angle of 88 degrees corresponds to the state that the diameter of the opening AP2 gradually increases toward the upper surface of the substrate.

In this embodiment, an expression "an inner wall rises near at a right angle relative to the semiconductor surface" is intended to include not only an inner wall rising at a right angle but also an inner wall rising at an angle in a range from 80 degrees to 90 degrees.

Figure 4B:
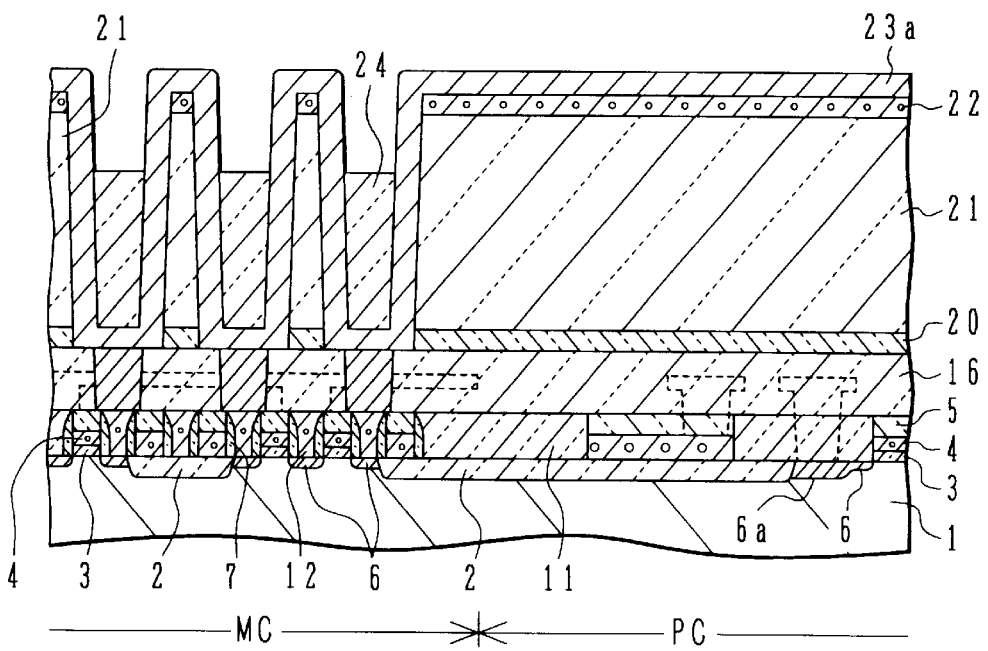

As shown in FIG. 4B, storage electrode material such as Ru 23a is deposited over the whole substrate surface by CVD. The thickness of the Ru film 23a is, for example, about 20 nm. Next, on the Ru film, an inner protective film 24 of, for example, SOG oxide, is formed. The inner protective film 24 is about 200 nm thick. The inner protective film 24 supports the thin Ru film and provides a function of preventing the Ru film from being etched.

Next, the inner protective film 24 is anisotropically etched to depress the inner protective film 24 lower in the opening AP2.

Next, the Ru film 23a is etched to remove the Ru film exposed on the surface and side walls of the insulating layer 11.

Figure 4C:
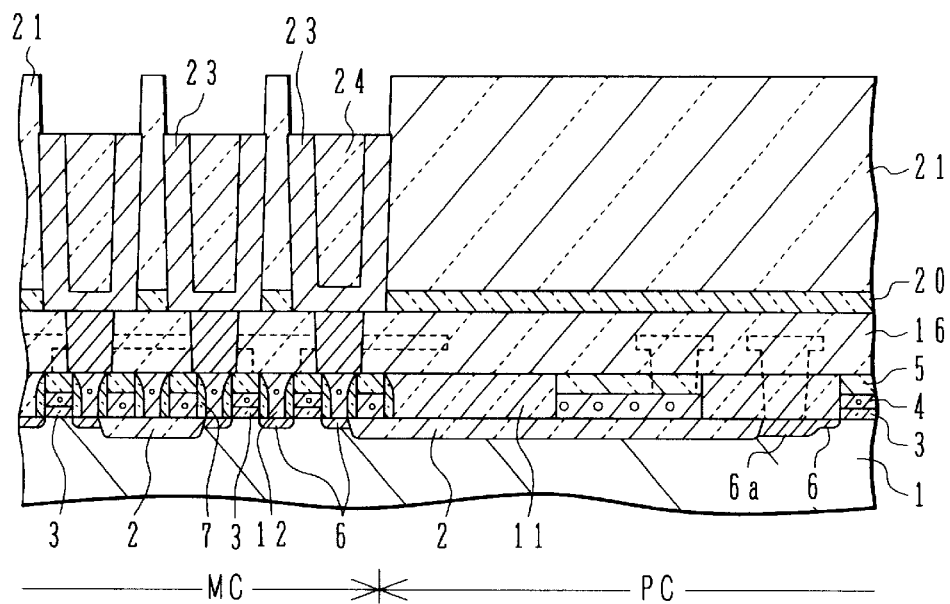

As shown in FIG. 4C, the Ru film is etched to the upper surface of the depressed inner protective film 24. A storage electrode 23 is therefore formed which is separated at each opening AP2.

Figure 4D:
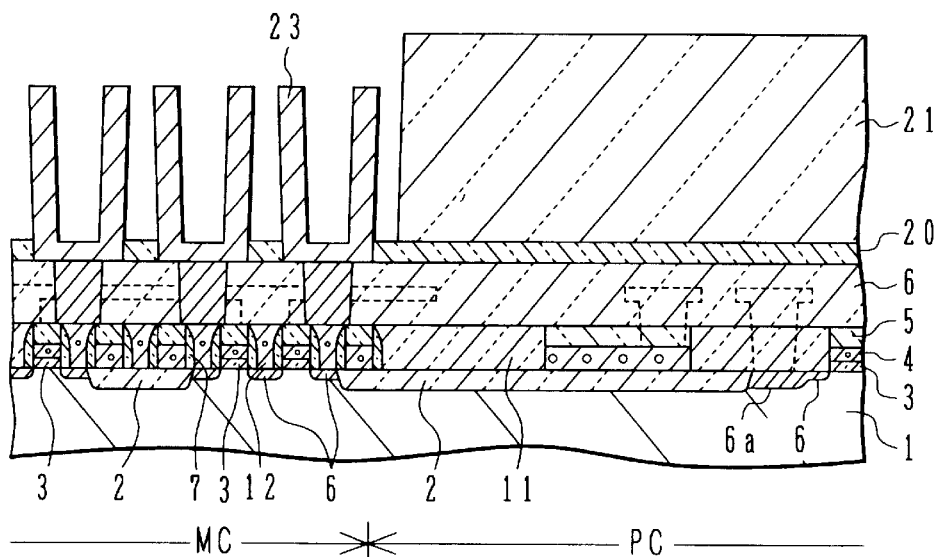

Next, as shown in FIG. 4D, the inner protective film 24 formed on the storage electrode 23 and the insulating layer 21 between the storage electrodes 23 are etched and removed. For this etching, at the initial stage, anisotropical etching is performed by reactive ion etching (RIE), and then an ashing process, a Colin process and an diluted hydrofluoric acid process are performed. As diluted hydrofluoric acid, buffer liquid of hydrofluoric acid and water mixed at a ratio of, for example, 2:100, is used.

Etching progresses quickly along the interface between the storage electrode 23 and insulating layer 21 to form a slit. Thereafter, etching progresses along the direction parallel to the substrate surface. With this etching process, the inner protective film 24 and the insulating film 21 between the storage electrodes 23 are removed. The inner protective film 24 of SOG is removed rapidly because its etch rate by hydrofluoric acid based etchant is faster than that of the insulating layer 21.

Figure 4E:
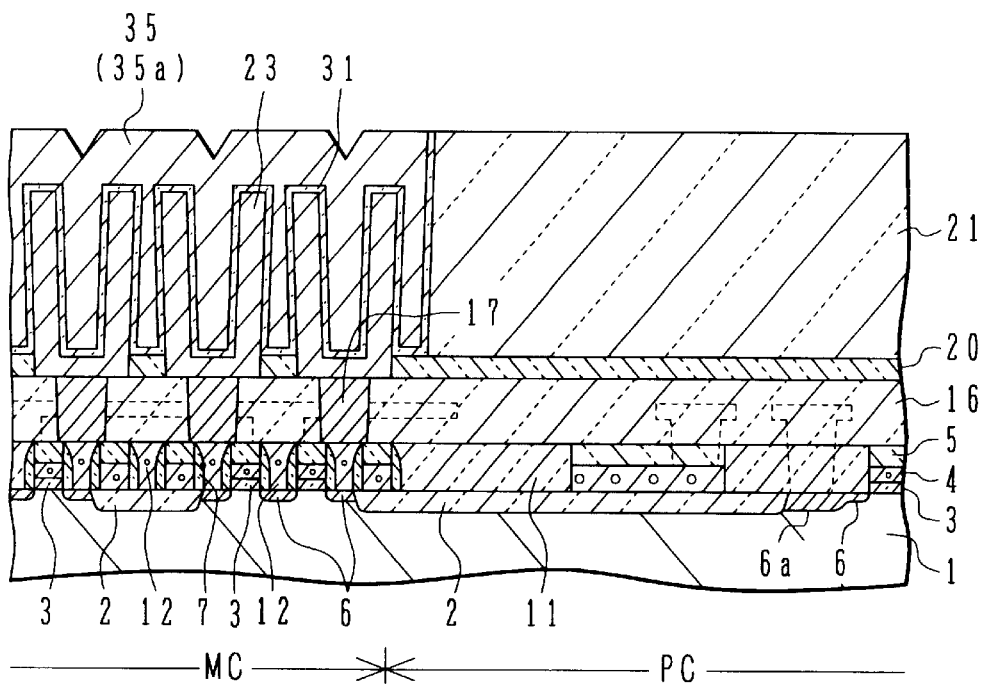

Next, as shown in FIG. 4E, a capacitor dielectric film 31 is formed. The material of the capacitor dielectric layer 31 is dielectric material, preferably material having a high dielectric constant such as $Ta_2O_5$. A thickness of the capacitor dielectric layer 31 is, for example, 10 nm. On the capacitor dielectric layer 31, a conductive layer 35a of TiON, Ru, W, WN, SRO or the like is formed by CVD. The thickness of the conductive layer 35a is, for example, 200 nm. The surface of the conductive layer 35a is planarized by CMP by using the surface of the insulating layer 21 in the peripheral circuit area PC as a stopper. A cell plate electrode 35 is therefore formed. As this planarizing process, an etch-back method may be used. The cell plate electrode 35 in the memory cell area MC is approximately flush with the surface of the insulating layer 21 in the peripheral circuit area PC.

Figure 4F:
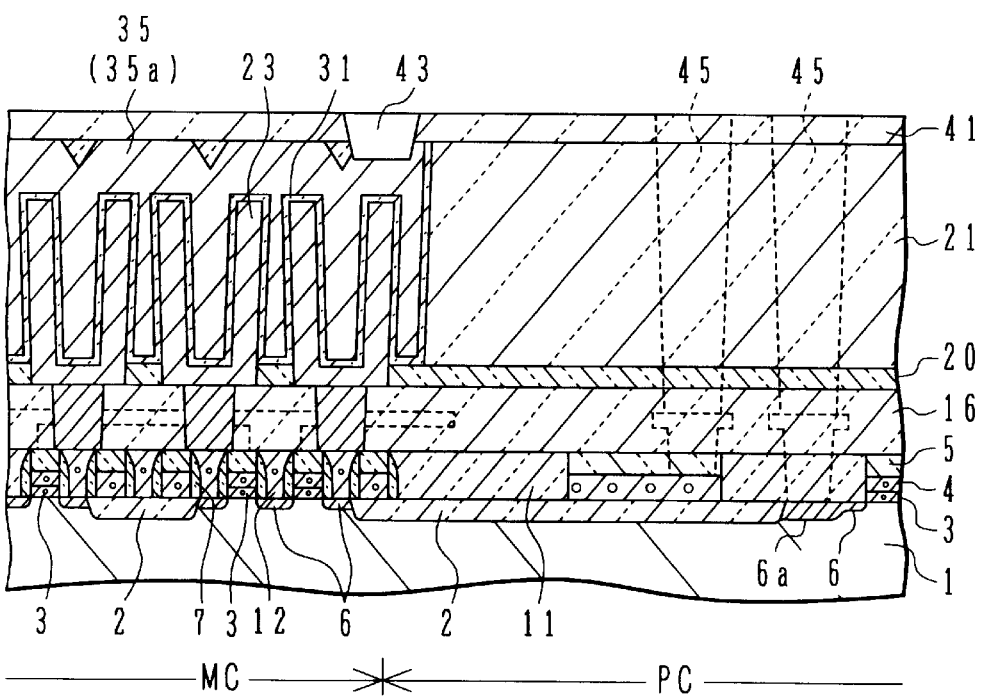

Next, as shown in FIG. 4F, an insulating film 41 is formed over the whole surface of the substrate. Thereafter, a contact hole 43 is formed above the cell plate electrode 35 and a contact hole 45 is formed above each transistor in the peripheral circuit area PC. The contact holes 43 and 45 are filled with conductive material, and an upper level wiring layer is formed.

The semiconductor device manufacture method of the first embodiment can remove the internal protective film in the storage electrode and the insulating layer between the storage electrodes almost selectively relative to the insulating layer in the peripheral circuit area.

It is therefore unnecessary to use the photolithography process of forming a mask to prevent the insulating layer in the peripheral circuit area from being etched at the same time when the internal protective film in the storage electrode and the insulating layer between the storage electrodes are removed. DRAM manufacture processes can be simplified.

The structures characteristic to DRAM manufactured by the embodiment semiconductor device manufacture method will be described with reference to FIGS. 5A and 5B and FIGS. 6A to 6D.

Figure 5A:
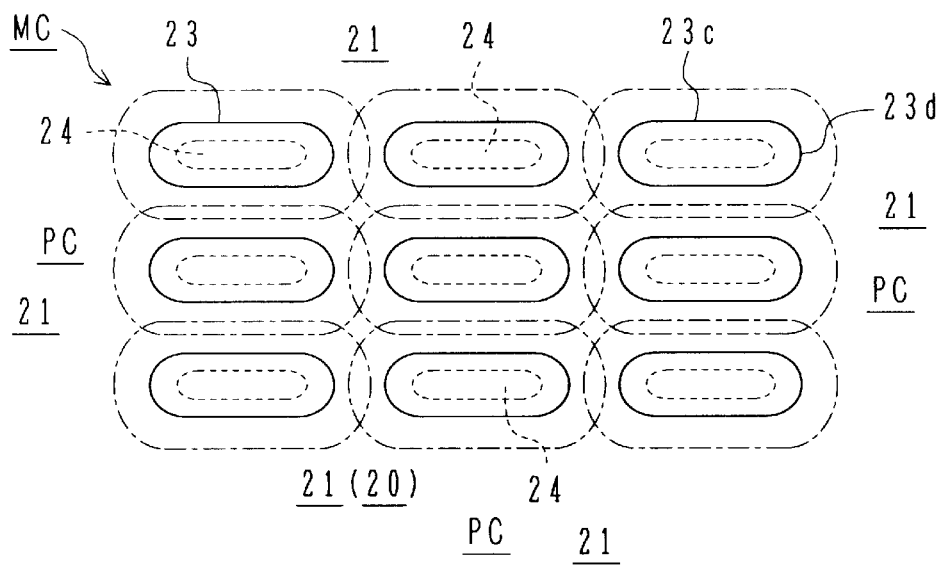
FIG. 5A is a schematic plan view of a semiconductor device of the first embodiment before etching and FIG. 5B shows the semiconductor device after etching.

As shown in FIG. 5A, the outer periphery of each of a number. of storage electrodes 23 formed in the memory cell area MC has a race track shape determined by a photolithography process. This race track shape is generally constituted of two parallel straight line segments 23c spaced by some distance and two arc line segments 23d connecting the straight line segments at their opposite ends.

During the etching process of separating the insulating layer 21 and storage electrode 23 in the memory cell area MC, the insulating layer in an area spaced by generally an equidistance from the outer periphery of the storage electrode 23 is also etched and the outer periphery of the storage electrode 23 is therefore reflected upon. As shown in FIG. 5A, the insulating layer 21 in an area inside of a virtual line indicated by a one-dot chain line is etched, reflecting upon the track race shape interconnecting the line segments 23c and 23d.

Figure 5B:
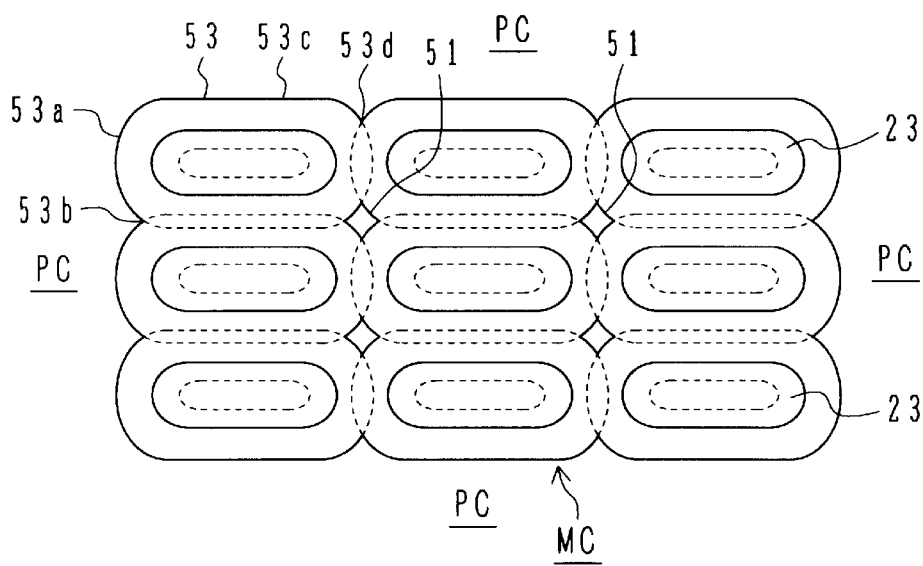

FIG. 5B shows the plan view after etching the insulating layer 21. The insulating layer in an area inside of the contour indicated by a solid line 53 is etched. The shape indicated by the solid line 53 is defined by interconnecting straight line segments 53c and arc line segments 53a respectively reflecting the straight line segments 23c of the outer peripheries of the storage electrodes shown in FIG. 5A and the arc line segments 23d shown in FIG. 5A. A line segment 53d inward depressed is formed between adjacent straight line segments 53c. Similarly, a line segment 53b toward which the insulating layer projects, is formed between adjacent arc line segments 53a. The solid line 53 defines a boundary between the memory cell area MC and peripheral circuit area PC.

The residual structure of the insulating layer to be described hereinafter is formed in the memory cell region MC if the distance between memory cells is made long or the over-etch is set small.

The insulating layer 51 of a tower shape, generally a rhomboid in cross section, is left at a cross point between two diagonal lines each interconnecting two centers of the memory cells among the four memory cells disposed up and down and right and left in the memory cell area MC.

A mask pattern practically used for a storage electrode is generally rectangular. The corners of the rectangular pattern are rounded by diffraction and interference during a photolithography process, and a regular rectangle pattern is difficult to be formed. There is the strong tendency that the distance between storage electrodes in a longer side direction becomes longer than that in a shorter side direction by the so-called shortening effect.

A distance between two storage electrodes disposed in a diagonal line direction among the four storage electrodes is longer than that between two storage electrodes disposed in the horizontal or vertical direction. Therefore, even if the insulating layer in an area between two storage electrodes disposed in the horizontal or vertical direction is etched by adding some over-etch time to the etch time necessary for etching this insulating layer, it is not always possible to perfectly etch the insulating layer in an area between two storage electrodes disposed in the diagonal line direction. Island-shaped, typically rhomboid-shaped, insulating layer regions are left.

If the etch time is set too long, the rhomboid-shaped insulating layer regions are removed. The shape and size of the rhomboid-shaped insulating layer 51 depend on the distance between storage electrodes and the etching amount.

If the etch time is set too long, the borderline 53 defining the boundary between the memory cell area MC and peripheral circuit area PC unnecessarily expands toward the peripheral circuit area PC. Namely, the insulating layer in the peripheral circuit area PC is over-etched. This over-etched region has no active function and wasteful. If such a wasteful region becomes broad, the chip area is occupied wastefully. The element integration degree lowers and hence a chip size and chip unit cost become large.

This unnecessary space can be filled with the plate electrode if the electrode is made thick. However, it takes an additional time to form such a thick plate electrode. As the plate electrode is made thick, another problem occurs such as cracks in the plate electrode.

Unnecessarily expanding the borderline 53 toward the outside of the memory cell area MC is therefore not advantageous. It is desired to suppress this expansion at the minimum. In this case, oxide poles are left between memory cells.

There are other variations of the structure of DRAM as shown in FIGS. 6A to 6D.

In the structure shown in FIG. 6A, if a distance between adjacent storage electrodes disposed in the horizontal direction is long, the rhomboid region is not formed between memory cells. Instead, a striped insulating layer region 55 is formed between two storage electrode columns each having a plurality of storage electrodes disposed in the vertical direction. The outer periphery of the striped insulating layer region 55 has the shape that inward projecting arc line segments 53a are regularly disposed in the vertical direction.

In the structure shown in FIG. 6B, if the storage electrodes are disposed in a slanted direction instead of the vertical direction, a striped insulating layer region 57 extending in the oblique direction is formed between two adjacent storage electrode columns. The outer periphery of the striped insulating layer region 57 extending in the oblique direction has the shape that inward projecting arc line segments 53a and portions of straight line segments 53a are connected together.

In the structure shown in FIG. 6C, if a distance between adjacent storage electrodes disposed in the vertical direction is long, a striped insulating layer region 60 is formed between adjacent storage electrodes rows each having a plurality of storage electrodes disposed in the horizontal direction. The outer periphery of the striped insulating layer region 60 has the shape that straight line segments 53c and portions of outward projecting arc line segments 53a are connected together.

In the structure shown in FIG. 6D, if distances between adjacent storage electrodes disposed in the horizontal and vertical directions are long, a separated unetched region is formed at each storage electrode. Namely, an opening having a cross section of a race track shape is formed in the insulating layer. In this opening, the storage electrode is formed in this opening, the storage electrode being separated by a constant distance from the insulating layer and having a plan view of the race track shape.

As described above, as the layout of storage electrodes in the memory cell array is changed, the shape of the insulating layer after etching is changed correspondingly. Although the shape of the insulating layer changes with the layout of storage electrodes, the outer periphery of the etched region of the insulating layer always reflects the outer periphery of the storage electrode. Etching starting from the outer periphery of the storage electrode is considered to be isotropically progressing along the direction parallel to the substrate surface. Therefore, a distance between the outer periphery of the storage electrode and the borderline defining the outer periphery of the etched region is almost constant. In this specification, an expression "the outer periphery of the storage electrode is reflected" means such a state.

As shown in FIGS. 6A to 6D, in the region where the etch distance in the direction parallel to the substrate surface is longer than the distance between adjacent storage electrodes, the insulating layer in this distance is removed completely during the etching. Also in this case, some portions of the insulating layer are left and their outer peripheries reflect the outer peripheries of the storage electrodes, so that it can be expressed that the outer periphery of the etched region reflects the outer periphery of the storage electrode. The expression "reflecting the outer periphery" also means such a state.

Next, a semiconductor device and its manufacture method according to a modification of the first embodiment will be described with reference to FIGS. 7A to 7D.

FIGS. 7A to 7D illustrate the process corresponding to the process of the first embodiment shown in FIG. 4C.

Figure 7A:
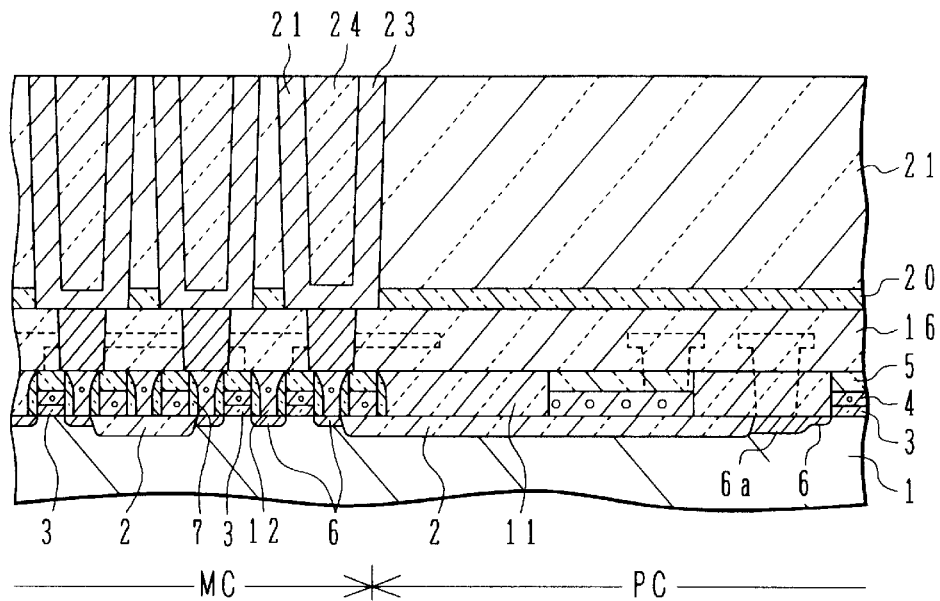
FIGS. 7A to 7D are schematic cross sectional views of a semiconductor substrate illustrating semiconductor device manufacture processes according to a modification of the first embodiment.

In the structure shown in FIG. 7A, the upper surfaces of the storage electrode 23 and inner protective film 24 are flush with the upper surface of the insulating layer 21. The upper surfaces of the storage electrode 23 and inner protective film 24 are not lower than the upper surface of the insulating layer 21, as different from the first embodiment.

In this structure, if the surface of the conductive layer 35a (shown in FIGS. 4E–4F) deposited as a plate electrode is planarized by CMP by using the surface of the insulating layer 21 in the peripheral circuit area PC as a stopper, the cell plate electrode at a level higher than the storage electrode is removed so that the resistance of the cell plate electrode rises. This is because the upper surface of the storage electrode 23 is almost flush with the upper surface of the insulating layer 21. In forming the plate electrode, it is therefore necessary to form a mask such as photoresist on the conductive layer 35a (shown in FIGS. 4E–4F).

Also in this structure, a mask is not necessary when the insulating layer and inner protective layer are etched and manufacture processes can be simplified.

Figure 7B:
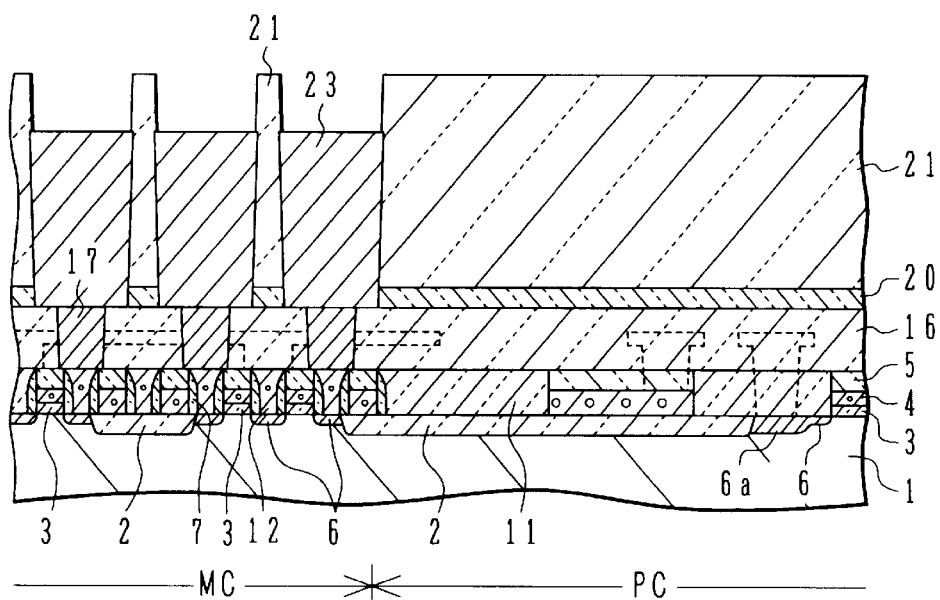

In the structure shown in FIG. 7B, an opening for the inner protective film is not formed, but a conductive film for the storage electrode is deposited thick to form a solid storage electrode of a so-called pedestal structure.

Also in this structure, a mask for covering the insulating layer 21 in the peripheral circuit area PC is not necessary when the insulating layer 21 between storage electrodes is etched. The surface of the storage electrode 23 is lower than the surface of the insulating layer 21 in the peripheral circuit area PC. Therefore, CMP or the like is used for forming the plate electrode, and a mask forming process is not necessary.

Figure 7C:
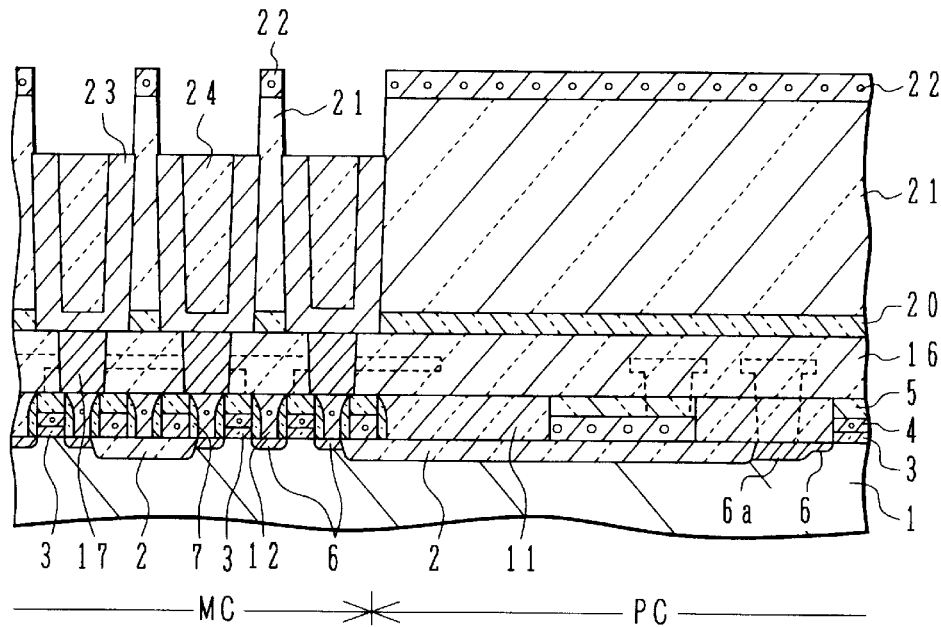

In the structure shown in FIG. 7C, while the insulating layer 21 is etched, the amorphous silicon film 22 is left on the insulating layer 21. This amorphous silicon film 22 functions as a so-called hard mask when reactive ion etching is performed for forming the opening for the storage electrode. The left amorphous silicon film 22 provides a function of suppressing thinning of the insulating layer 21 from the upper surface of the insulating film 21.

It is necessary to set the storage electrode lower than the height at the interface between the amorphous silicon film 22 and insulating layer 21, in order to make wet etching solution permeate the interface between the insulating layer 21 and storage electrode 23 by exposing the side wall of the insulating layer 21 to remove it.

The amorphous silicon film 22 is removed after the insulating layer is etched. To keep the strength of the amorphous silicon film 22, insulating material such as $Al_2O_3$ and $Si_3N_4$ may be a support of the amorphous silicon film 22.

Even if the insulating layer 21 is etched by hydrofluoric acid etchant, the amorphous silicon film 22 is left unetched. The amorphous silicon film 22 is generally formed thin and its mechanical strength is weak. In order to maintain the mechanical strength of the amorphous silicon film 22, the residual insulating layer of the rhomboid shape may be used as a support for the amorphous silicon film 22.

Figure 7D:
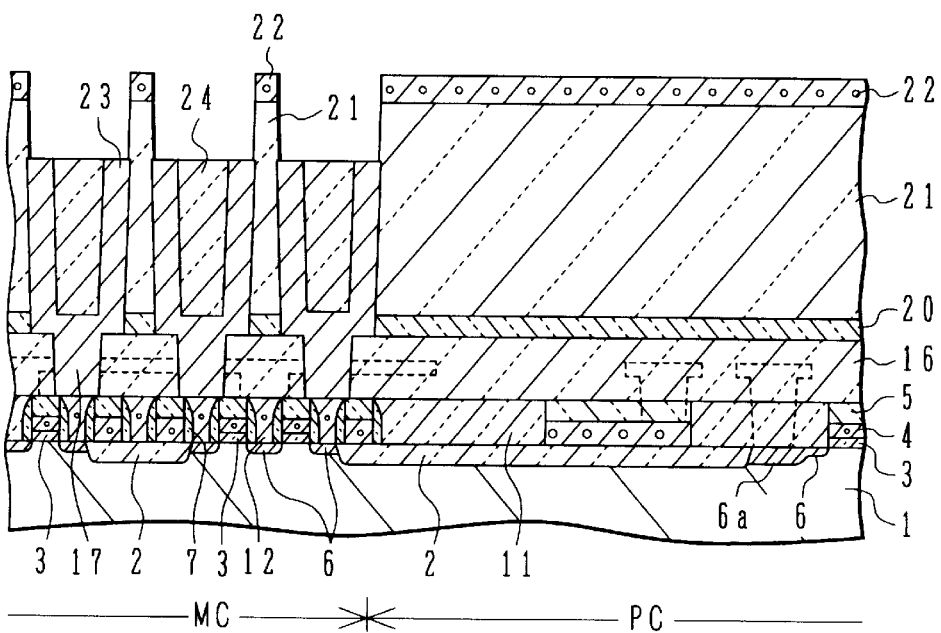

In the structure shown in FIG. 7D, the plug forming process is omitted. The opening for the storage electrode and the underlying contact hole are formed integrally. The storage electrode and plug are integrally made of storage electrode conductive material.

A semiconductor manufacture method according to the second embodiment of the invention will be described.

The semiconductor device manufacture method of the second embodiment utilizes the second approach to speeding up the etch rate of the insulating layer near at the interface between the insulating layer and storage electrode.

After the storage electrode is formed in the opening of the insulating layer, a heat treatment is performed at a temperature in the range from 350° C. to 800° C. The material of the storage electrode may be Ru, $RuO_2$, Pt, W, WN, TiN, SRO, Ir, or $IrO_x$.

Materials constituting the storage electrode, e.g., Ru, diffuses into the insulating layer near at the interface between the storage electrode and insulating layer. As Ru diffuses into the insulating layer, an etch rate of the insulating layer by hydrofluoric acid based etchant increases. The insulating layer near at the interface between the storage electrode and insulating layer is etched quickly. By using this phenomenon, the insulating layer between the storage electrodes can be almost selectively etched relative to the insulating layer in the peripheral circuit area. Other processes are similar to the manufacture processes for semiconductor devices of the first embodiment.

Polysilicon doped with impurities may be used as the conductive material of the storage electrode. In this case, impurities such as phosphorous, arsenic and boron are diffused into the insulating layer by a heat treatment. Diffused impurities increase the etch rate of the insulating layer. Similar to bad adhesion at the interface between the storage electrode and insulating layer, the insulating layer between the storage electrodes can be almost selectively etched relative to the insulating layer in the peripheral circuit area.

Next, a semiconductor device manufacture method according to the third embodiment of the invention will be described.

The semiconductor device manufacture method of the third embodiment utilizes the third approach to speeding up the etch rate of the insulating layer near at the interface between the insulating layer and storage electrode.

Before storage electrode material is deposited on the insulating layer, a thin separation film is formed having a fast etch rate by wet etching. As the storage electrode material deposited on the insulating layer is polished by CMP or the like, the top ends of the separation films are exposed. After the storage electrode is formed, the separation film is removed selectively or by an etching process capable of rapidly etching the separation film. After the separation film is removed, a slit is therefore formed at the interface between the storage electrode and insulating layer and thereafter the insulating layer is etched. Etchant for the insulating film permeates the slit and starts etching the insulating layer. The separation film and insulating film may be etched by the same etching process or different etching processes.

Specific processes for the third approach will be described with reference to FIGS. 8A to 8F.

Figure 8A:
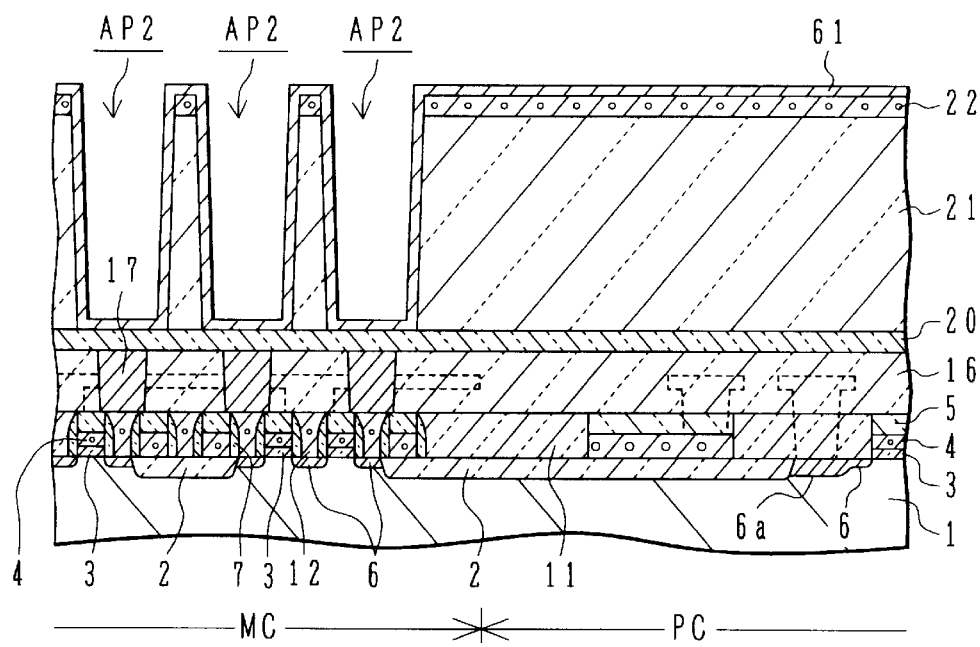
FIGS. 8A to 8F are schematic cross sectional views of a semiconductor substrate illustrating semiconductor device manufacture processes according to a third embodiment of the invention.

As shown in FIG. 8A, while an opening AP2 is formed through the insulating layer 21, the nitride film 20 formed under the thick insulating layer 21 is used as an etch stopper. Etching is stopped at the surface of the nitride film 20. Openings are not formed through the nitride film 20.

Although the openings may be formed through the nitride film 20, it is advantageous that the openings are not formed at this stage because the storage electrode to be later formed can be prevented from falling.

Next, a separation film 61 is formed on the substrate surface including the inner wall of the opening AP2 by CVD or sputtering. The separation film 61 is made of material having a faster etch rate by predetermined etchant than that of the insulating layer 21. For example, Ti is used as the material of the separation film. The separation film 61 of Ti has a film thickness of, for example, about 5 nm on the inner wall of the opening AP2.

As the material of the separation film 61, the material is desired which does not react with the material of the storage electrode, which is easy to be anisotropically etched, and which is easy to be etched with etchant other than HF.

Figure 8B:
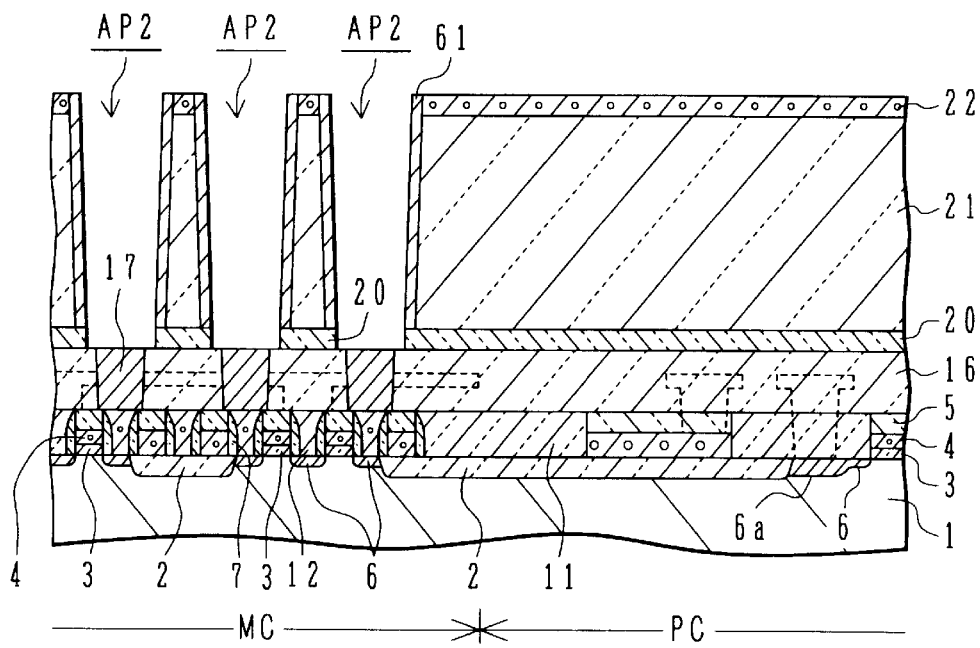

As shown in FIG. 8B, the separation film 61 of Ti is anisotropically etched.

The following anisotropical etching conditions may be used.

For polysilicon, mixture gas of $CF_4$ and $O_2$ is used. For W, gas of $SF_6$ is used. For Al, TiN, Ti or $Al_2O_3$, gas of $SiCl_4$ is used. For C or an organic film, gas of $O_2$ is used. For $Si_3N_4$, mixture gas of $CF_4$ and $O_2$ is used.

Without forming a C film or an organic film, a coated film (protecting the inner wall of the opening AP2 and allowing vertical etching) deposited on the inner wall when the opening is formed by anisotropical etching, may be used without removing it. Instead of such a film, residue left when the opening is chemically processed may also be used.

With this anisotropical etching, the Ti separation film 61 is left as a separation film 61 only on the inner wall of the opening AP2.

The nitride film 20 on the bottom of the opening AP2 is etched and removed to expose the surface of the contact plug 17 (to be connected to the source or drain of the cell transistor).

Figure 8C:
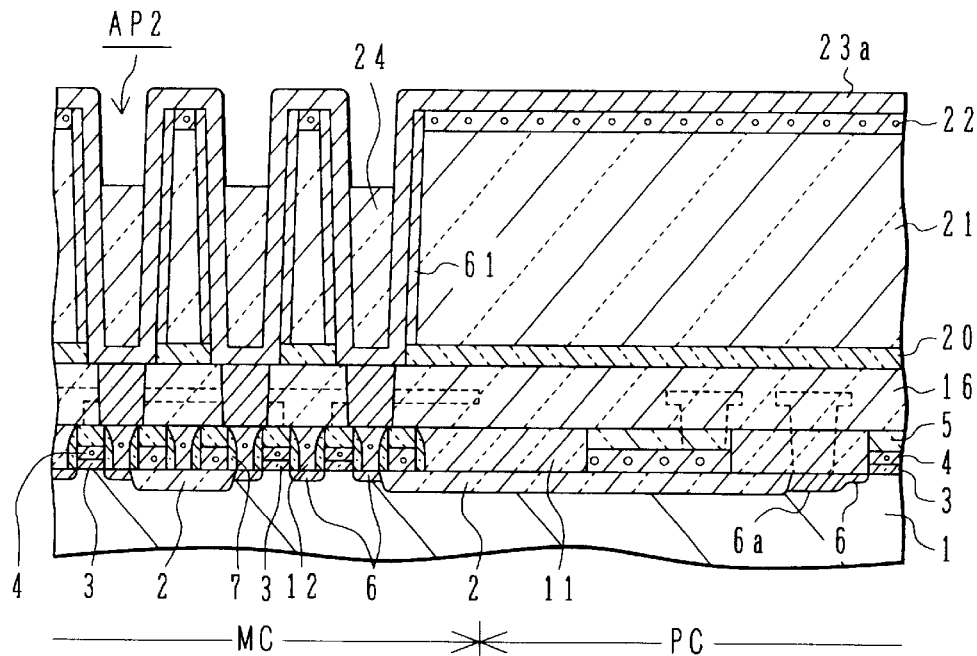

As shown in FIG. 8C, a storage electrode 23a of conductive material is formed. The conductive material is, for example, Ru. Ru is deposited to about 20 nm by CVD or the like.

Figure 8D:
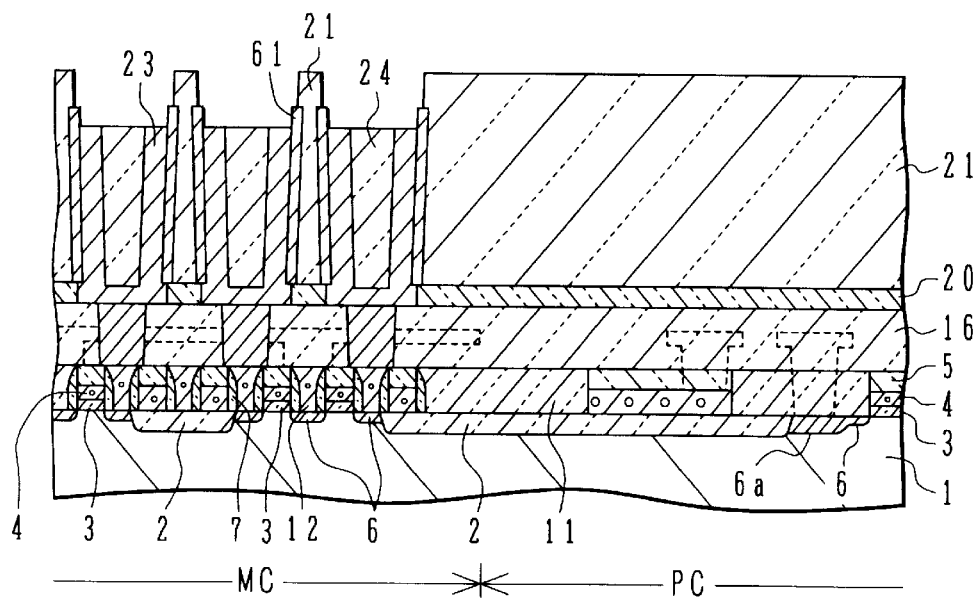

Resist, SOG or the like is buried in the opening AP2 to form an inner protective film 24 whose upper surface is lower than the upper surface of the storage electrode. As shown in FIG. 8D, the storage electrode 23a of Ru is partially etched to expose the upper surface and partial side wall of the insulating film 21.

Next, the whole substrate surface is etched by etchant such as boiled hydrochloric acid, boiled sulfuric acid, and mixed solution of sulfuric acid and hydrogen peroxide. Depending upon the material of the separation film 61, the following wet etching may be used.

For W, etchant of boiled hydrochloric acid is used. For polysilicon, mixed solution of diluted HF and $HNO_3$ is used. For TiN, mixed solution of hydrogen peroxide and sulfuric acid is used. For Al, etchant of HCl is used. For $Al_2O_3$, etchant of boiled sulfuric acid is used.

Figure 8E:
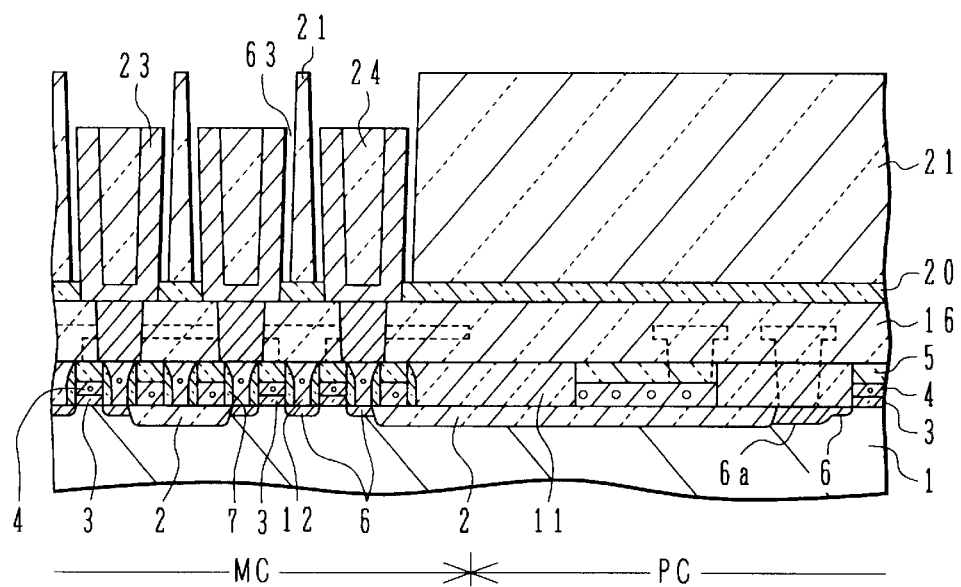

As shown in FIG. 8E, the separation film 61 (e.g., Ti) formed on the inner wall of the opening is etched so that a slit 63 extending from the upper surface of the substrate to the lower nitride film 20 is formed at the interface between the storage electrode 23 and adjacent insulating layer 21.

Figure 8F:
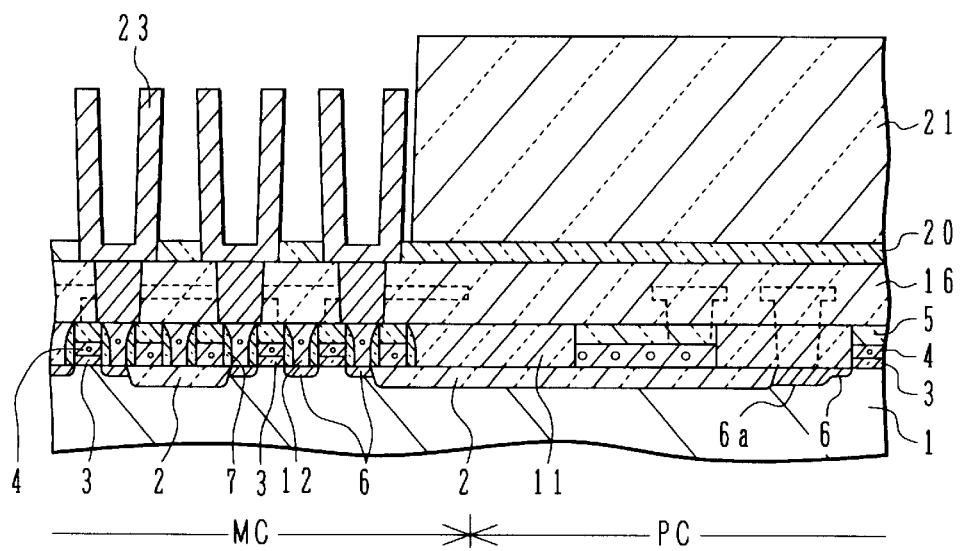

As shown in FIG. 8F, an etching process using hydrofluoric acid based etchant is performed. Hydrofluoric acid based etchant permeates the slit 63 (FIG. 8E) deeply to isotropically etch the insulating layer 21 between storage electrodes 23. Similar to the first and second embodiments described above, a mask for protecting the insulating layer in the peripheral circuit area is not necessary.

As etchant used for the separation film removing process, etchant not containing hydrofluoric acid is preferably used because if hydrofluoric acid based etchant is used, the insulating layer 21 in the peripheral circuit area is etched.

If the etch rate of the separation film 61 by HF is sufficiently faster than that of the insulating layer 21, etchant containing HF may be used.

The slit 63 is not formed at the interface between the nitride film 20 and storage electrode 23. Since the nitride film 20 as a spacer is interposed between adjacent storage electrodes in the horizontal direction, a fall possibility of the storage electrode 23 lowers.

If the Ti separation film 61 is formed after openings are formed through the nitride film 20, the Ti separation film 61 is formed also on the side walls of the nitride film 20. Since the slits are formed between the side walls of the nitride film 20 and the outer walls of the storage electrodes 23, the storage electrodes become likely to fall.

In the semiconductor device manufacture method of this embodiment, it is preferable to change the conditions of forming the Ru storage electrode by CVD differently from the conditions of the semiconductor manufacture method of the first embodiment.

In the semiconductor device manufacture method of the first embodiment, it is preferable to properly control adhesion at the interface between the Ru storage electrode and silicon oxide insulating film (control to weaken adhesion to some extent) to make hydrofluoric acid based etchant permeate the interface quickly.

In contrast, in the semiconductor device manufacture method of this embodiment, it is preferable to increase adhesion at the interface between the Ru storage electrode and insulating layer to make hydrofluoric acid based etchant be difficult to permeate the interface between Ru and insulating layer. To this end, for example, during the Ru film forming process, a thin RuO film is formed at the initial stage by adding a small amount of oxygen to the atmosphere, and then a supply of oxygen is stopped to form the final Ru film.

By using this method, adhesion between the insulating layer (silicon oxide film or the like) and the RuO film becomes good. Therefore, even if hydrofluoric acid based etchant is used for etching Ti film 61, the etching is hard to permeate the interface.

Next, a semiconductor device and its manufacture method according to the fourth embodiment will be described with reference to FIG. 9.

Also in the semiconductor device manufacture method of this embodiment, the phenomenon of a fast etch rate at the interface between the storage electrode and adjacent insulating layer is utilized.

This phenomenon is preferably stopped at the surface of the insulating layer 16 (mainly an oxide film) formed under the storage electrode 23 and not etched. If the etching does not stop at the surface of the insulating layer 16, the insulating layer 16 which supports the lower part of the storage electrode 23 is etched and the sufficient support mechanism for the storage electrode 23 may be lost and the device structure may be broken. There is also a possibility of losing insulation of the storage electrode 23 and the normal device characteristics.

The semiconductor device manufacture method of this embodiment takes this problem into consideration and adopts the structure and processes to be described herein under.

Figure 9:
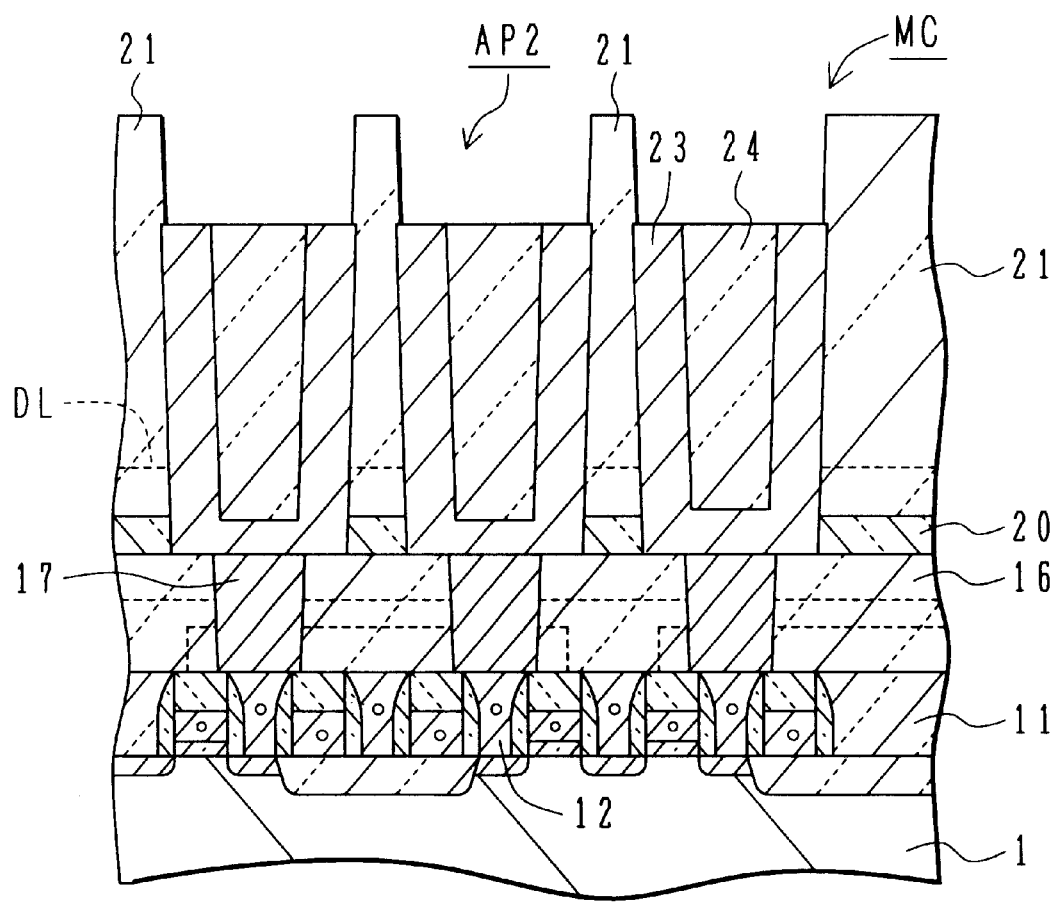
FIG. 9 is a schematic cross sectional view of a semiconductor substrate illustrating semiconductor device manufacture processes according to a fourth embodiment of the invention.

As shown in FIG. 9, an insulating tight adhesion layer 20 is formed surrounding the lower part of the storage electrode 23. This tight adhesion layer 20 is made of material having good adhesion to the storage electrode 23 and a very slow etch rate of etchant used for etching the insulating layer near at the interface between the storage electrode and adjacent insulating layer. For example, the tight adhesion layer 20 is a silicon nitride film. When the insulating layer 21 near at the interface between the storage electrode and adjacent insulating layer is etched, this tight adhesion layer 20 provides also the function of an etch stopper for preventing the lower structure from being etched.

After the opening is formed through the tight adhesion layer in the opening AP2 for forming the storage electrode, conductive material of the storage electrode is deposited.

The outer wall of the storage electrode 23 and the inner wall of the tight adhesion layer 20 are in contact with each other. At the interface between the tight adhesion layer 20 and storage electrode 23, the phenomenon of the fast etch rate of hydrofluoric acid based etchant does not occur. The slit etched by hydrofluoric acid based etchant is not formed in the contact area between the outer wall of the storage electrode 23 and the inner wall of the tight adhesion layer 20.

If the tight adhesion layer 20 provides an insufficient function of preventing the slit from being formed, the tight adhesion layer 20 serving also as the etch stopper is made thicker.

The tight adhesion layer 20 may be made thicker to about a half of the height of the storage electrode 23 (refer to a broken line DL). As the tight adhesion layer 20 is made thicker, the capacitance of each storage capacitor is reduced by an amount corresponding to the area of the outer walls of the storage electrode 23 covered with the inner walls of the tight adhesion layer 20. In this case, however, almost all the area of the inner wall of the storage electrode can be used as an element of the storage capacitor.

After the tight adhesion layer constructed as above is formed, the storage electrode 23 is formed by a method similar to that described earlier, and then the insulating layer 21 between adjacent storage electrodes is removed. Since the tight adhesion layer 20 also functioning as the etching stopper is sufficiently thick, during the etching process of forming the slit along the outer wall of the storage electrode 23, the slit forming is stopped at some depth of the tight adhesion layer and there is only a small possibility of forming the slit reaching the region under the storage electrode.

A composite film (multi-layer film) may be used as the tight adhesion layer 20. For example, a two-layer or three-layer structure of nitride/oxide or nitride/oxide/nitride may be used. If at least one layer on the upper surface side of the composite film has good adhesion to the storage electrode 23 and HF resistance and can prevent permeation of HF at the interface, the composite film can function as the tight adhesion layer serving also as the etch stopper, similar to the above-described single tight adhesion layer.

Next a semiconductor device and its manufacture method according to a modification of the fourth embodiment of the invention will be described.

In this modification, instead of a silicon nitride film used as the tight adhesion layer 20, a tantalum oxide film (e.g., $Ta_2O_5$, $Ta_2O_6$ or the like), a barium strontium tantalate (BST) film, a strontium tantalate (ST) film, an alumina ($Al_2O_3$) film or the like is used. One silicon nitride layer of the three-layer structure may be replaced by one of these films.

These materials are hardly etched by hydrofluoric acid based etchant and have good adhesion to the material of the storage electrode, such as Ru.

During the etching process of forming a slit along the outer wall of the storage electrode with hydrofluoric acid based etchant, forming the slit is stopped at some depth of the tight adhesion layer and there is only a small possibility that the slit reaches the region under the storage electrode.

Next, a semiconductor device and its manufacture method according to the fifth embodiment of the invention will be described.

Figure 10:
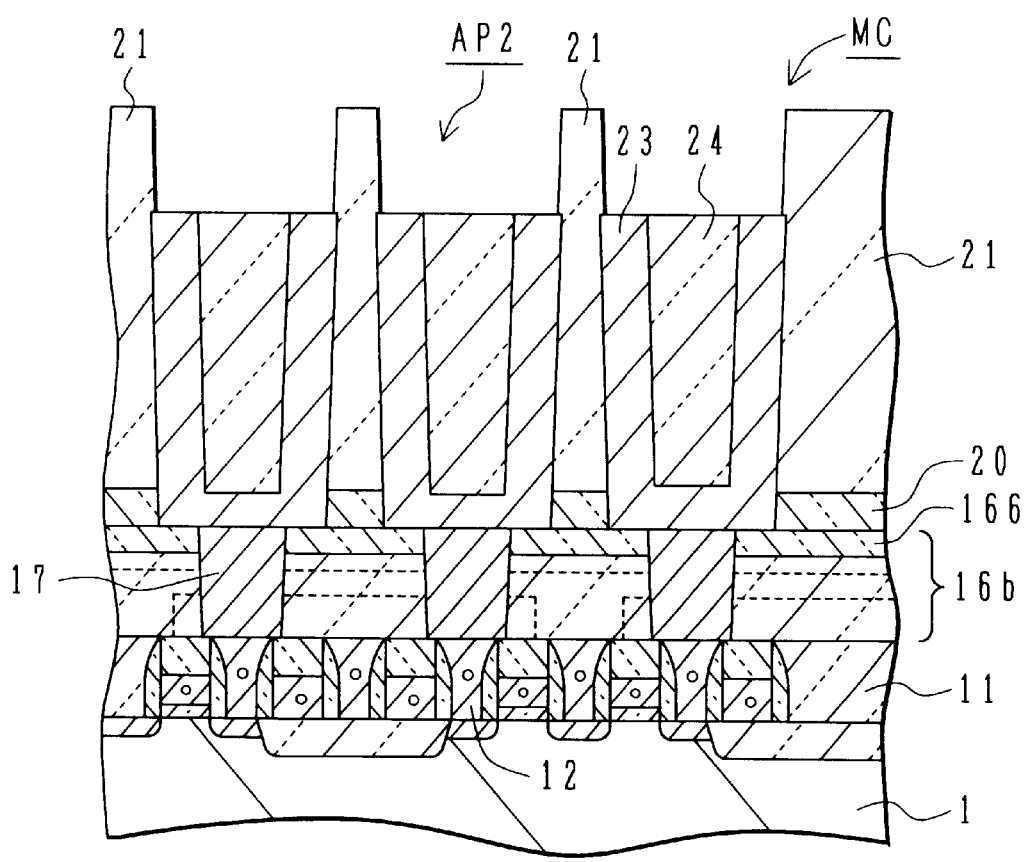
FIG. 10 is a schematic cross sectional view of a semiconductor substrate illustrating semiconductor device manufacture processes according to a fifth embodiment of the invention.

FIG. 10 is a cross sectional view of a substrate showing the structure of a semiconductor device and illustrating its manufacture method of the fifth embodiment.

In the structure shown in FIG. 10, a surface layer 16b of the insulating layer 16 surrounding the plug 17 formed under the storage electrode 23 is resistant against hydrofluoric acid etchant and has good adhesion to the material of the plug 17. The insulating layer 16 may have a three-layer structure, such as nitride/oxide/nitride.

FIGS. 11A to 11C and FIGS. 12A and 12B illustrate the processes of forming the structure shown in FIG. 10.

A silicon oxide film 16c is deposited on the first inter-level insulating film 11. A groove not reaching the surface of the first inter-level insulating film 11 and a contact hole to the lower-level structure are formed in and through the silicon oxide film 16c. A wiring layer of, for example, W, is filled in the groove and contact hole.

Thereafter, an insulating layer 16a of, for example, silicon nitride, is formed to bury the W wiring layer. If necessary, the surface of the insulating layer 16a is planarized.

Next, a nitride film 16b is formed by CVD to a thickness of, for example, 50 nm to 200 nm.

As shown in FIG. 11 B, by using a photoresist pattern as a mask, contact holes AP3 are formed through the nitride film 16b, nitride film 16a and oxide film 16c. The contact holes AP3 are used for electrical connection to the source/drain regions of memory cell transistors. In forming the contact holes AP3, which exposed an upper surface of the plug 12, a SAC process generally used as a DRAM manufacture process may be used, or other processes may also be used so long as the opening for electrical connection to the source/drain regions can be formed.

The contact hole AP3 may be used for electrical connection to the source/drain regions via another plug 12 made of a material different from that of the plug 17, such as doped polysilicon and TiN.

With the SAC structure, the upper surface and side walls of the bit line BL are covered with a nitride film which is hardly etched under the etching conditions of etching the insulating layer 16. Therefore, the contact hole AP3 can be formed in a self alignment manner without considering an alignment margin between bit lines BL.

Figure 11A:
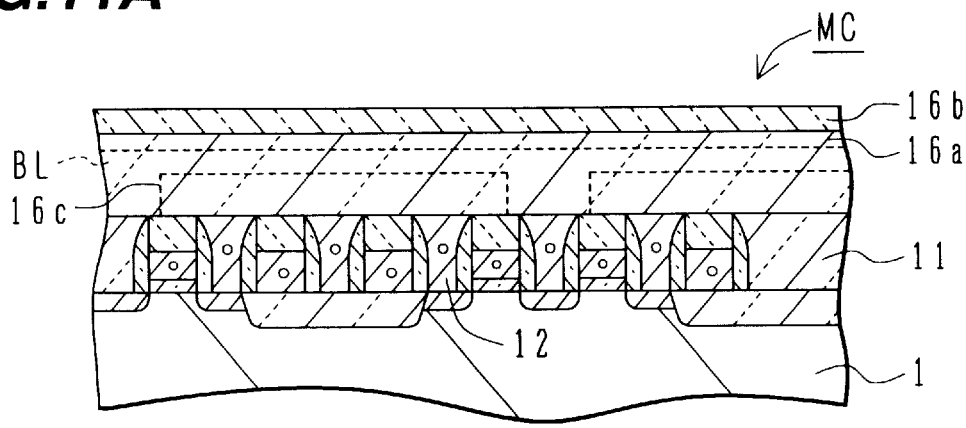
FIGS. 11A to 11C are schematic cross sectional views of a semiconductor substrate illustrating semiconductor device manufacture processes according to the fifth embodiment of the invention.
Figure 11B:
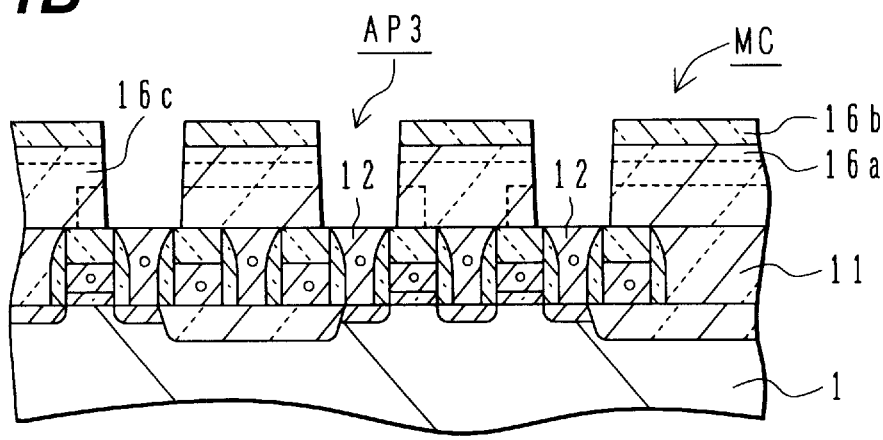
Figure 11C:
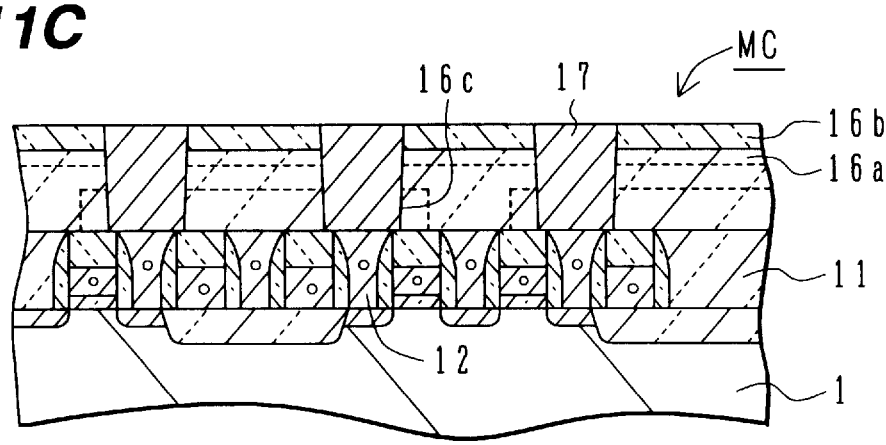

As shown in FIG. 11C, conductive material is deposited over the whole substrate surface. The conductive material is resistant to hydrofluoric acid based etchant, and is selected from W, TiN, Pt, TiN, WN, RuO, Ru, doped polysilicon, W/TiN/Ti and the like. The conductive material or materials are therefore filled in the contact hole AP3.

This plug conductive material filled in the contact hole AP3 is different from the material of the storage electrode 23 made of, for example, Ru. As different from the interface between the storage electrode and oxide film, the plug conductive material has preferably good adhesion to the insulating layer and an etch rate not too fast.

Next, the plug conductive material on the nitride film 16b is removed by CMP, etch-back or the like. The plug structure filled in the contact hole is therefore formed, the plug being made of conductive material such as W, TiN, doped polysilicon, W/TiN/Ti, WN, RuO, and Ru. This plug 17 is electrically connected to the plug 12 made of polysilicon.

Figure 12A:
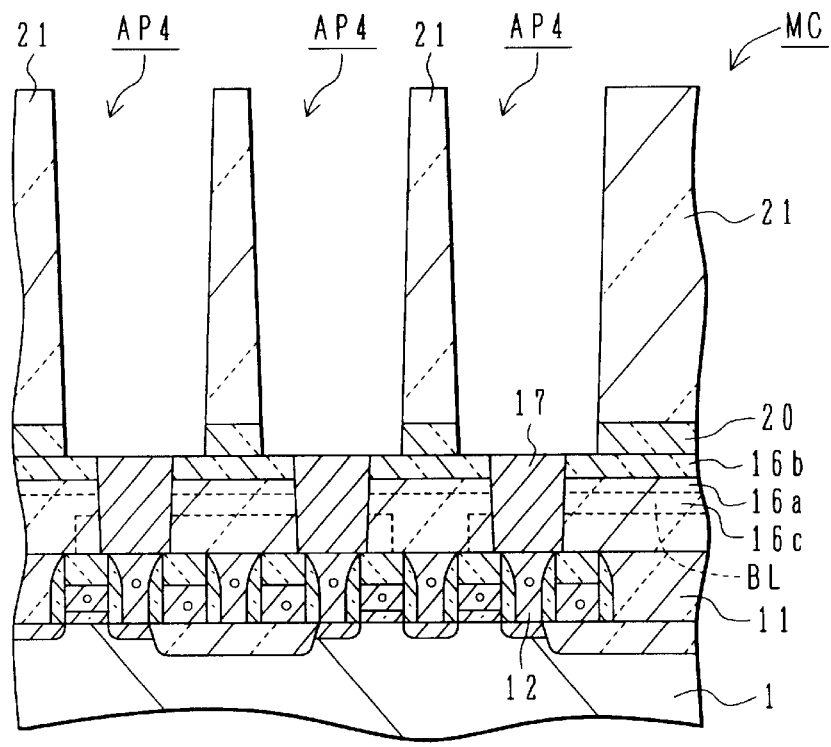
FIGS. 12A and 12B are schematic cross sectional views of a semiconductor substrate illustrating semiconductor device manufacture processes according to the fifth embodiment of the invention.

As shown in FIG. 12A, a nitride film 20 is formed on the whole substrate surface, and on this nitride film 20, a thick oxide film 21 is formed. The nitride film 20 may be omitted. Storage electrode openings AP4 are formed through the thick oxide film 21 and nitride film 20, reaching the surface of the plugs 17.

Figure 12B:
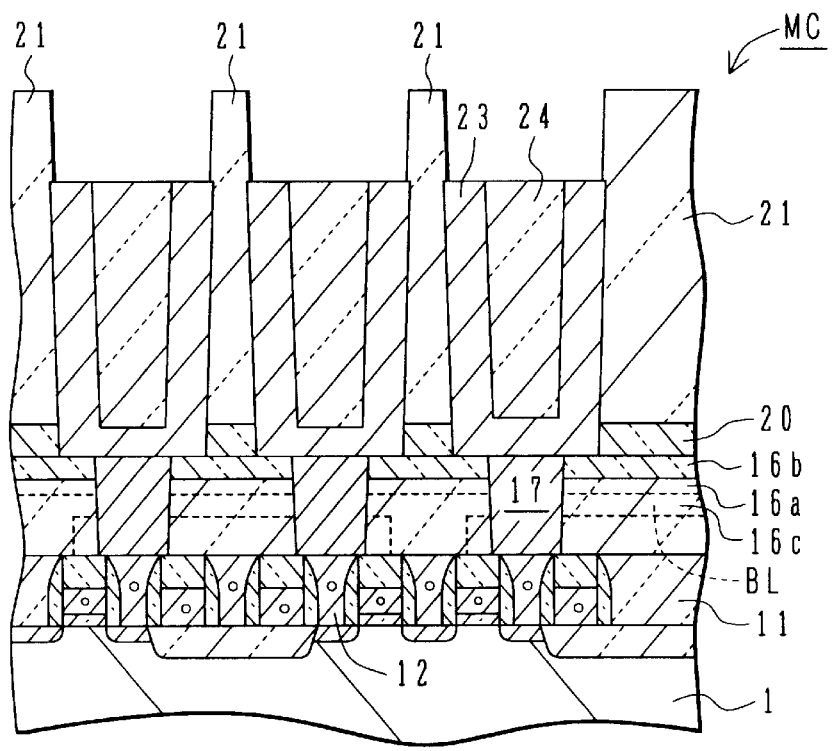

As shown in FIG. 12B, a storage electrode 23 of Ru is formed by CVD. This process of forming the storage electrode 23 is similar to that described earlier.

A slit to be later formed in the insulating layer 21 near at the interface between the storage electrode and adjacent insulating layer 21 does not reach the region under the storage electrode 23. The plug 17 and the nitride film 16b surrounding the plug 16b have good adhesion. In addition, the etch rate of the plug 17 and nitride film 16b by hydrofluoric acid based etchant is very slow. There is only a small possibility that hydrofluoric acid based etchant permeates the interface between the nitride film 16b and plug 17 and a slit is formed along this interface. The slit is stopped at the surface of the lower-level structure (nitride film 16b and plug 17) so that the slit does not enter the region under the storage electrode.

In this specification, the structure of the storage electrode formed on the plug is collectively called an electrode where applicable.

Next, a semiconductor device and it manufacture method according to the sixth embodiment of the invention will be described.

Figure 13A:
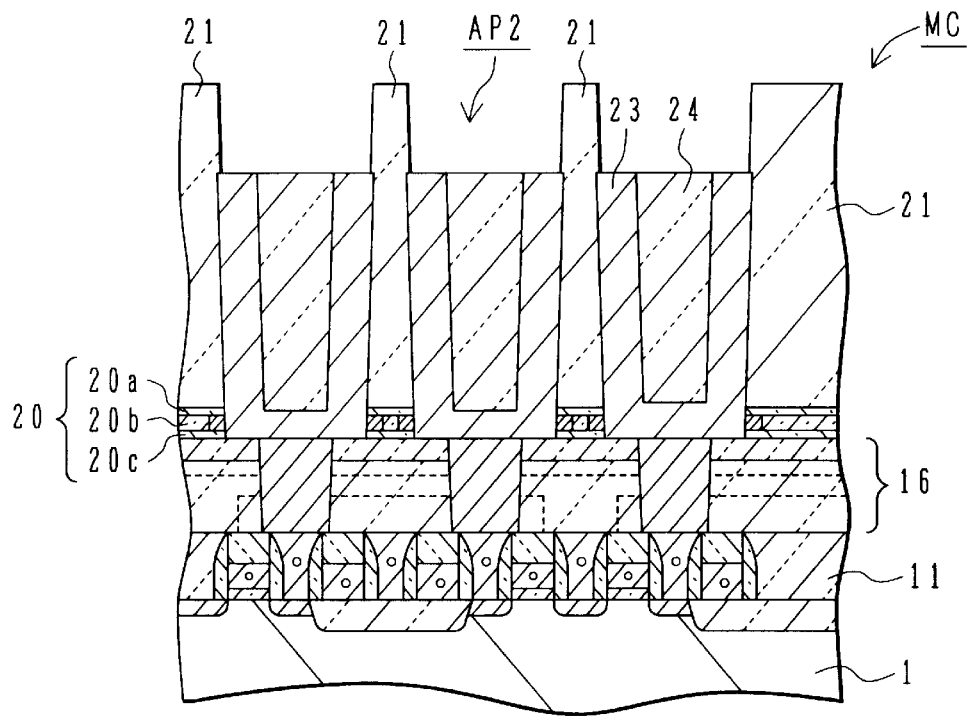
FIGS. 13A and 13B are schematic cross sectional views of a semiconductor substrate illustrating semiconductor device manufacture processes according to a sixth embodiment of the invention.

FIG. 13A is a cross sectional view showing the structure of a semiconductor device and illustrating its manufacture method of the sixth embodiment. In the structure shown in FIG. 13A, the etching stopper/slit intercepting film shown in FIGS. 9 and 10 is changed to have a three-later structure such as silicon nitride/ silicon oxide/silicon nitride.

In place of a silicon oxide film, a film made of $Ta_2O_5$, alumina, BST, or STO may be used.

Processes of forming the structure shown in FIG. 13A are shown in FIGS. 14A to 14E.

In the three-layer structure, the upper and lower two layers are resistant against hydrofluoric acid etchant, and the middle layer can be isotropically etched under some etching conditions.

In the structure shown in FIG. 13A, the nitride film 20 under the thick oxide film 21 shown in FIGS. 9 and 10 is changed to have the three-layer structure. The manufacture method thereof will be described.

Figure 14A:
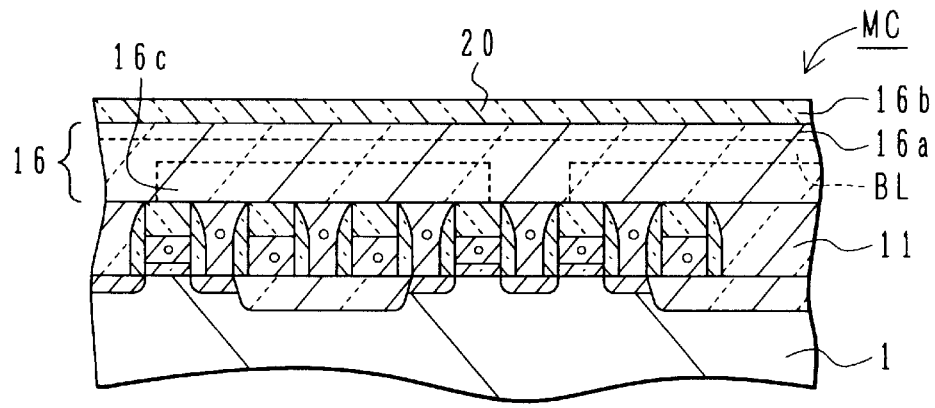
FIGS. 14A to 14E are schematic cross sectional views of a semiconductor substrate illustrating semiconductor device manufacture processes according to the sixth embodiment of the invention.

As shown in FIG. 14A, a nitride film 16a and an oxide film 16b are formed covering the bit line BL. The oxide film may be omitted.

Figure 14B:
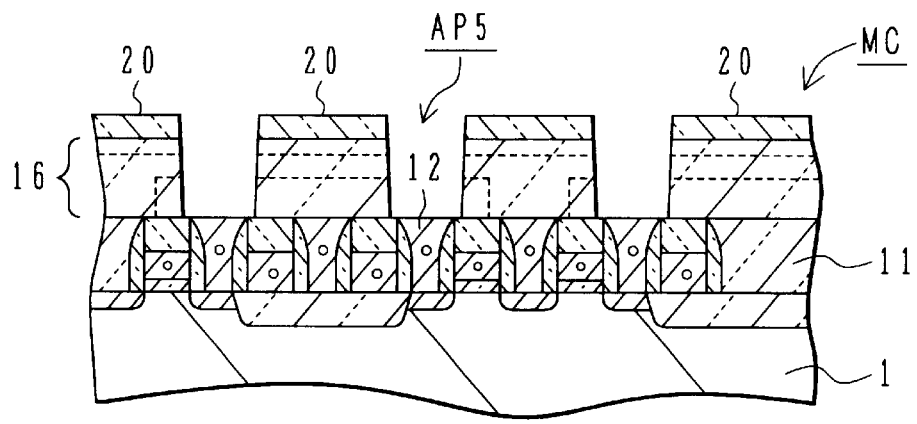

As shown in FIG. 14B, contact holes AP5 for plugs are formed. The contact hole is formed through the nitride film 16a and oxide film 16b and reaches the surface of the plug 12.

Figure 14C:
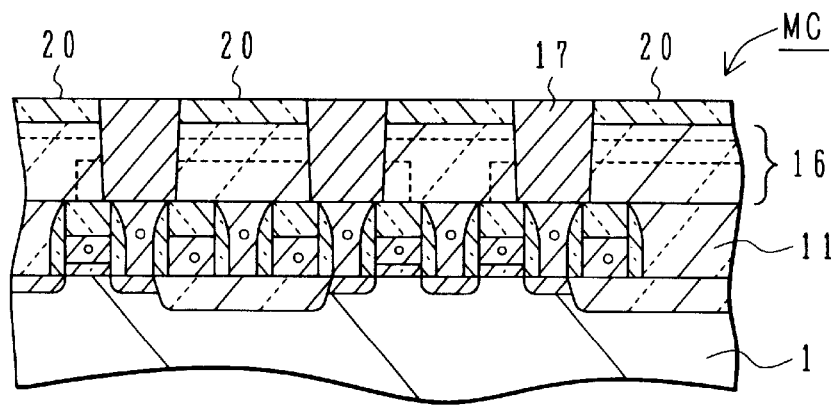

As shown in FIG. 14C, plug material is filled in the opening AP5 by a process similar to that described above to form a plug 17.

Figure 14D:
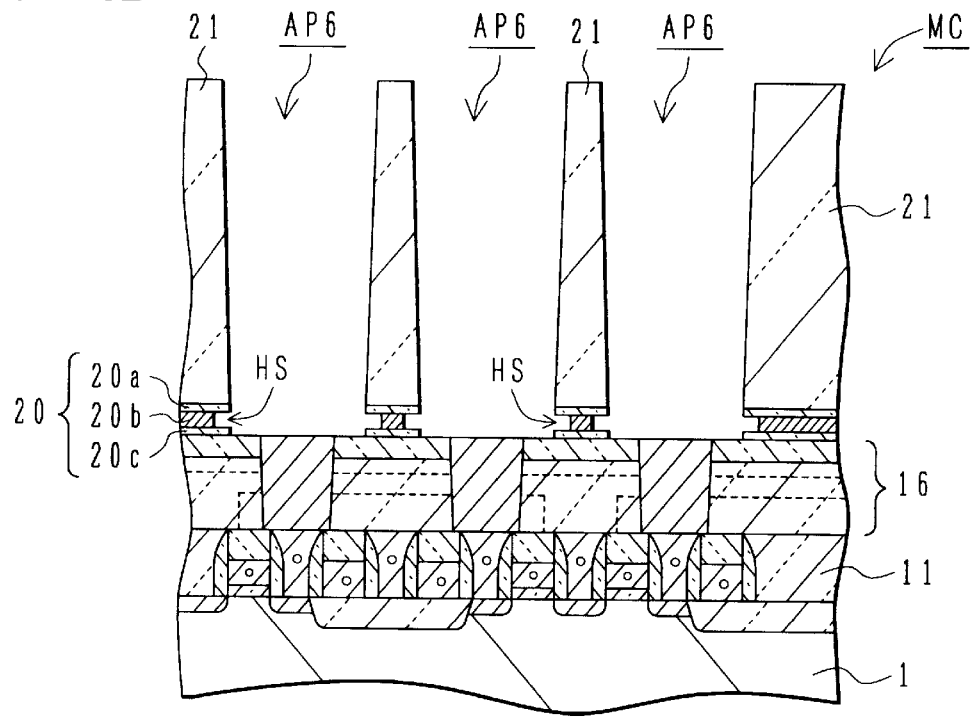

As shown in FIG. 14D, a three-layer structure 20 and an insulating layer 21 are formed over the whole substrate surface. A storage electrode opening AP6 is first formed on the surface of an uppermost nitride film 20a of the three-layer structure 20. Next, the uppermost nitride film 20a is etched. Then, a middle film 20b is laterally etched by using hydrofluoric acid based etchant to form a laterally extending slit HS. During this etching, a lowermost nitride film 20c is not etched.

Next, the lowermost nitride film 20c is partially etched and removed. In this manner, the storage electrode opening AP6 exposing the surface of the lower plug is formed.

Figure 14E:
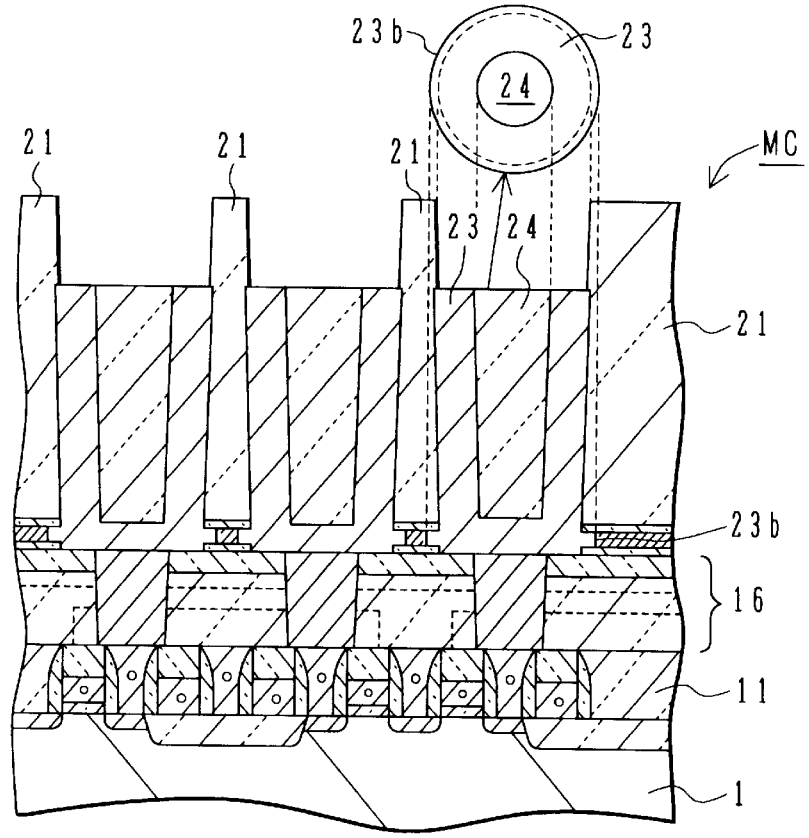

As shown in FIG. 14E, by using the process described earlier, the storage electrode 23 is formed.

For example, the storage electrode is made of an Ru film or a WN film formed by CVD. An Ru or WN CVD film has good step coverage so that storage electrode material is filled in the laterally extending slit HS.

As shown in FIG. 14E, a ring projection 23b is formed projecting from a lower outer wall of the storage electrode 23.

Since the ring projection 23b of the storage electrode 23 contacts the surfaces of the upper and lower nitride films 20a and 20c, a distance along the outer wall of the storage electrode 23 to the lower-level oxide film becomes substantially long. It is therefore possible to reliably prevent hydrofluoric acid based etchant from permeating the lower-level region.

In addition, the storage electrode 23 is hard to fall because its ring projection 23b enters the laterally extending slit HS. Since the storage electrode 23 is supported strongly, a fall of the storage electrode can be prevented.

Next, a semiconductor device and it manufacture method according to the seventh embodiment of the invention will be described.

A three-layer structure similar to that of the sixth embodiment is formed above the bit line BL.

Figure 13B:
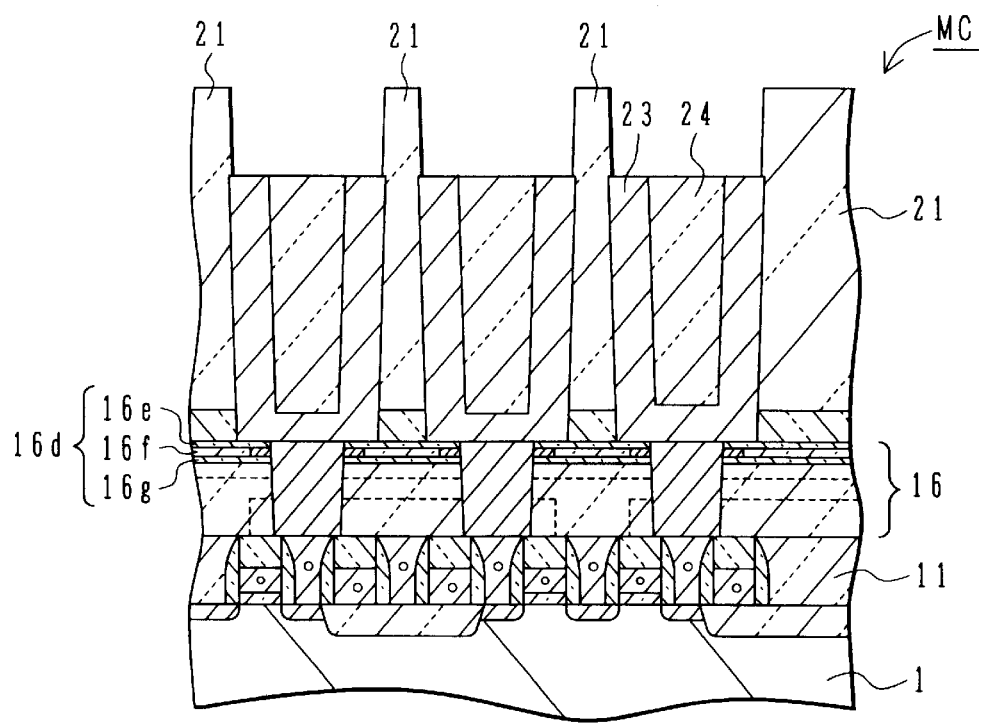

The structure of the semiconductor device is shown in FIG. 13B and the manufacture method is illustrated in FIGS. 15A to 15F.

Figure 15A:
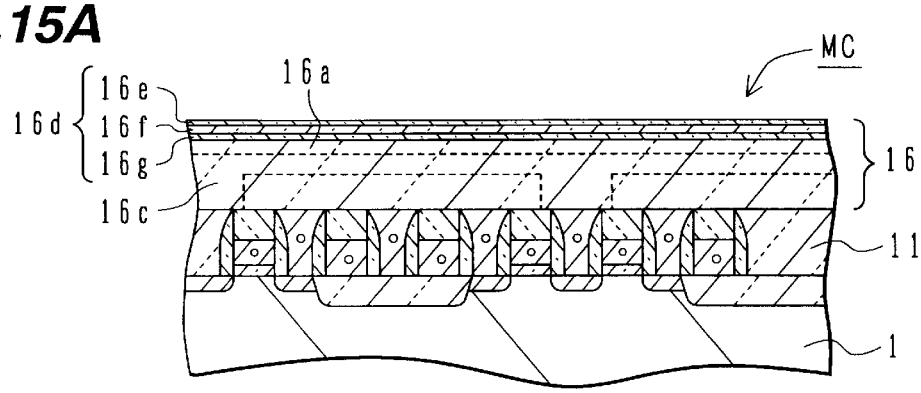
FIGS. 15A to 15F are schematic cross sectional views of a semiconductor substrate illustrating semiconductor device manufacture processes according to a seventh embodiment of the invention.

As shown in FIG. 15A, an uppermost insulating layer 16d of the insulating layer 16 has a three-layer structure of films 16e, 16f and 16g.

Figure 15B:
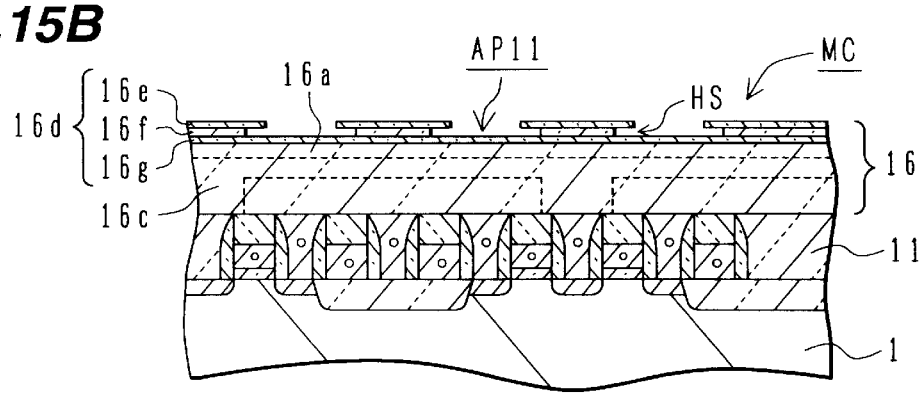

As shown in FIG. 15B, the uppermost nitride film 16e is selectively etched to form openings and expose the middle layer (oxide film) 16f of the three-layer structure.

The middle layer (oxide film) 16f is etched with hydrofluoric acid based etchant to form a laterally extending slit HS.

During this etching, as different from the structure of the sixth embodiment, the insulating layer 21 is not still formed so that it is not necessary to consider any etching of the insulating layer 21 and the like. This etch amount can therefore be determined only by considering the length of the laterally extending slit SH.

Figure 15C:
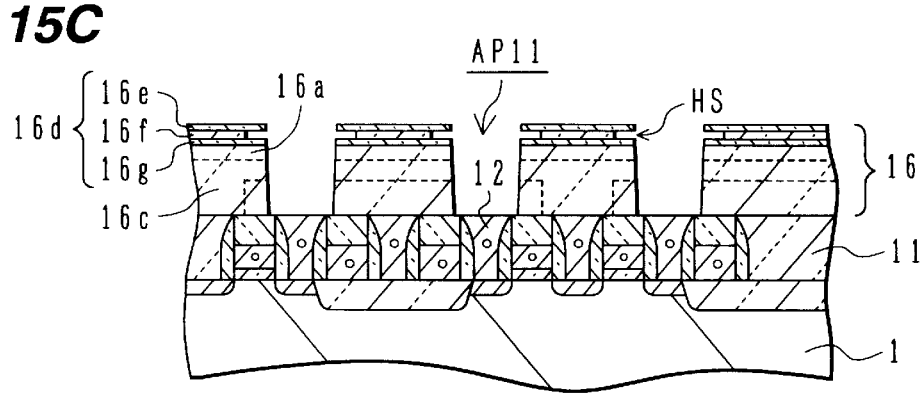

Next, as shown in FIG. 15C, the lowermost nitride film 16g of the three-layer structure is selectively etched, and then the nitride film 16a and oxide film 16c are anisotropically etched to form contact holes AP11 reaching the surfaces of the plugs 12.

The nitride film 16a and oxide film 16c are anisotropically etched because if they are isotropically etched, the middle oxide film 16f is again etched so that it becomes difficult to control the length of the laterally extending slit SH.

Figure 15D:
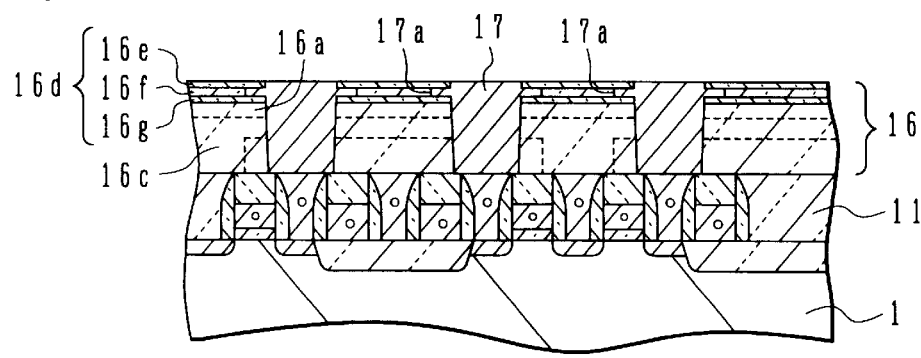

As shown in FIG. 15D, plug conductive material is filled in the contact holes AP11. This conductive material enters the laterally extending slit HS. A projection 17a projecting from the outer wall of the plug 17 is therefore formed. The contact area of the plug 17 with the nearby nitride films 16e and 16g increases and a distance of a permeation route of hydrofluoric acid based etchant becomes long. It is therefore possible to reliably prevent hydrofluoric acid based etchant from entering the lower-level structure.

Figure 15E:
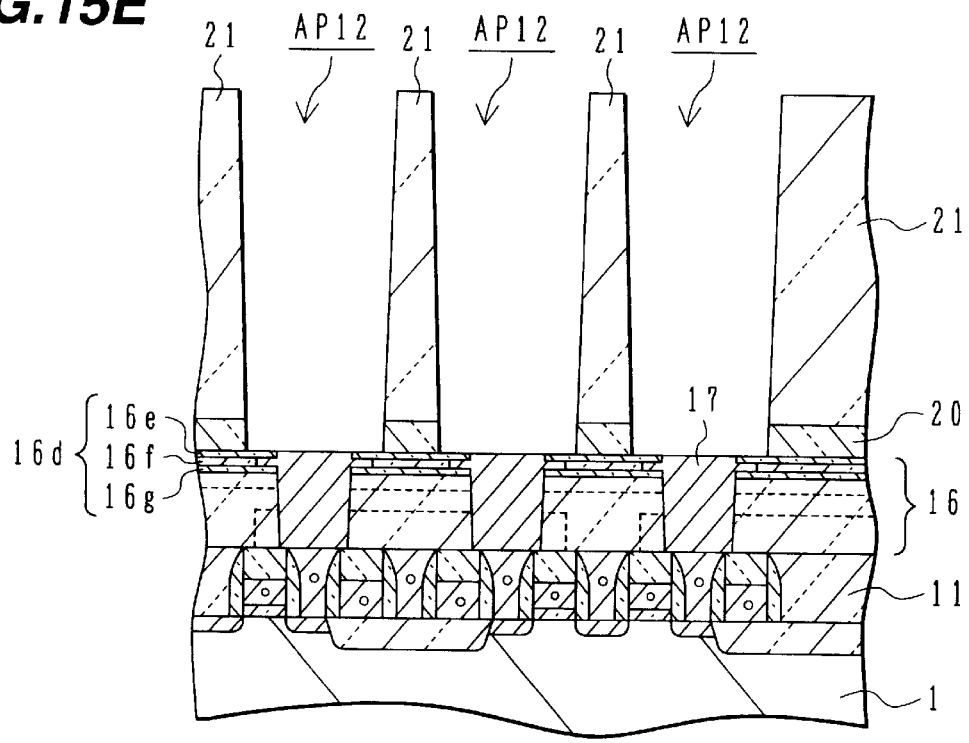
Figure 15F:
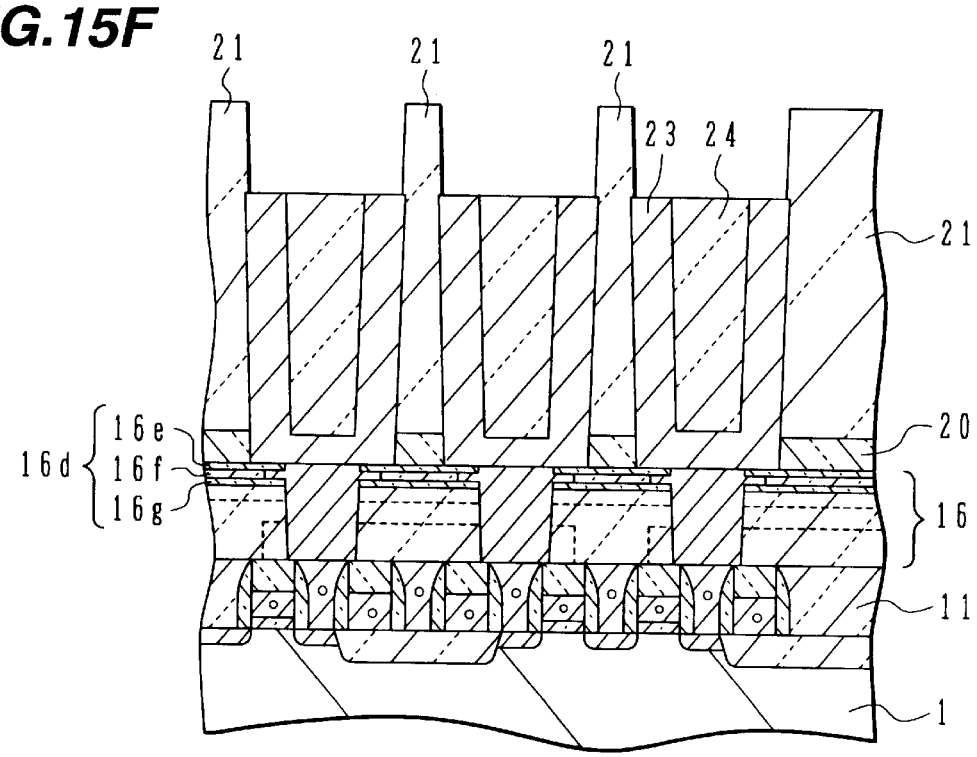
Figure 16A:
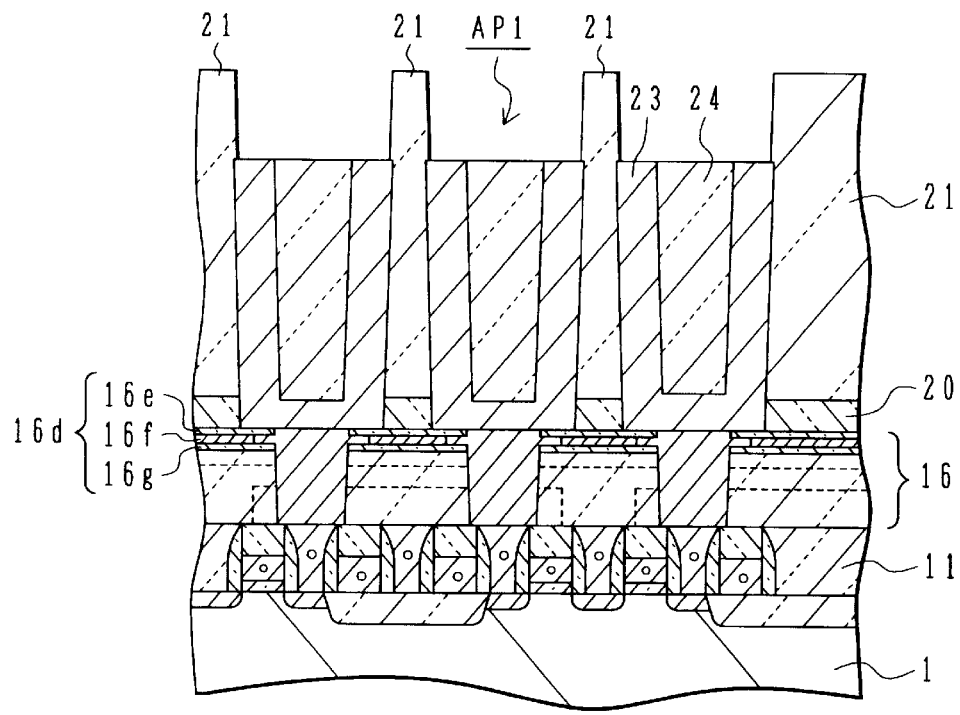
FIGS. 16A to 16D are schematic cross sectional views of a semiconductor substrate illustrating semiconductor device manufacture processes according to another embodiment of the invention.
Figure 16B:
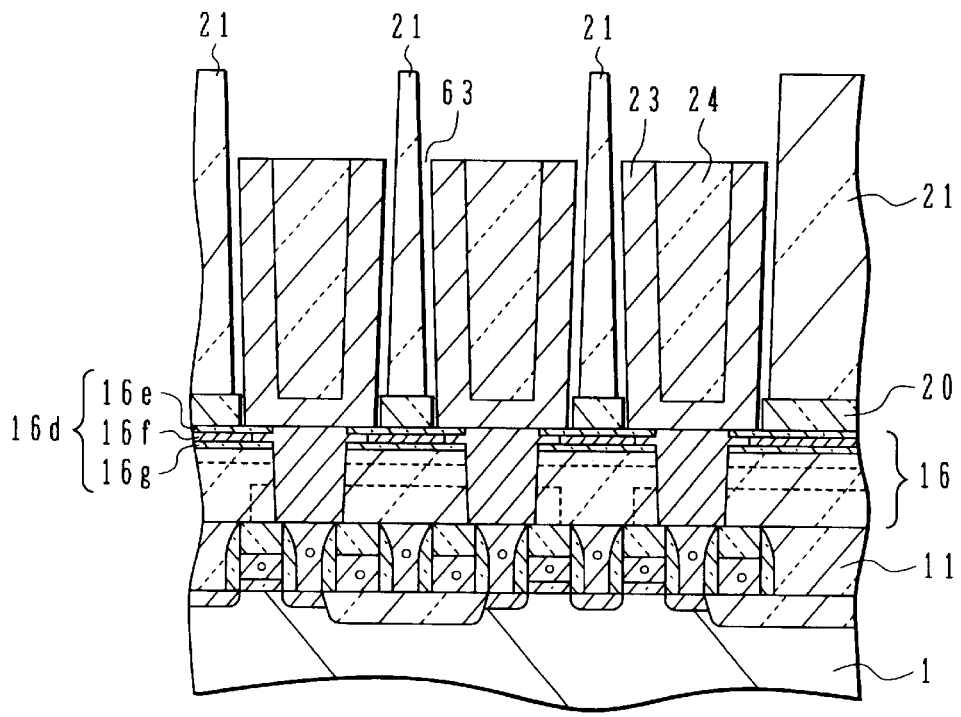
Figure 16C:
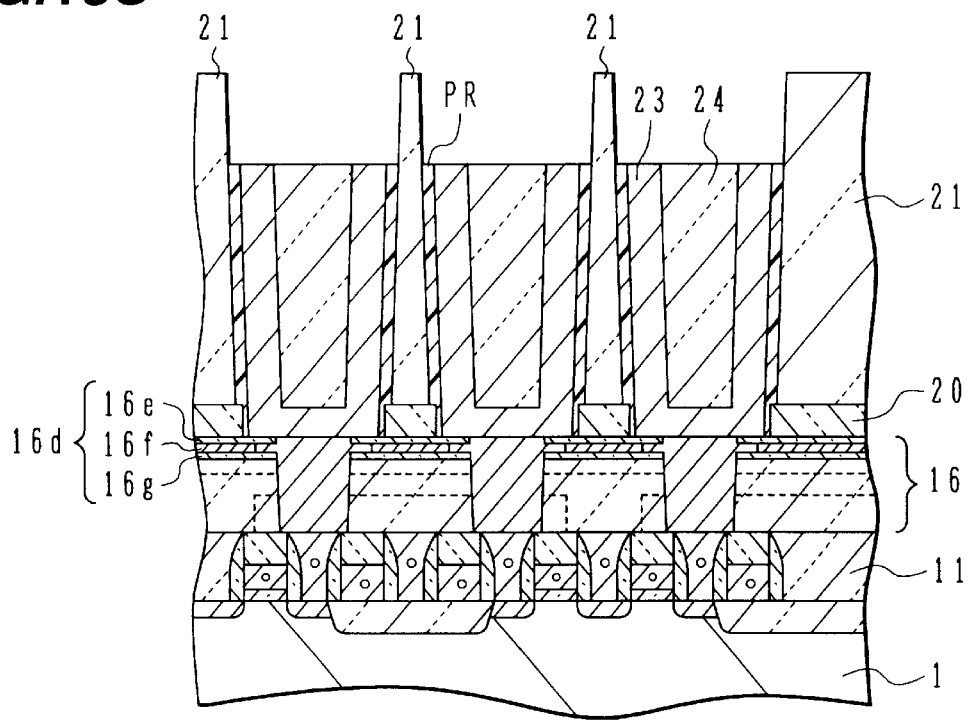
Figure 16D:
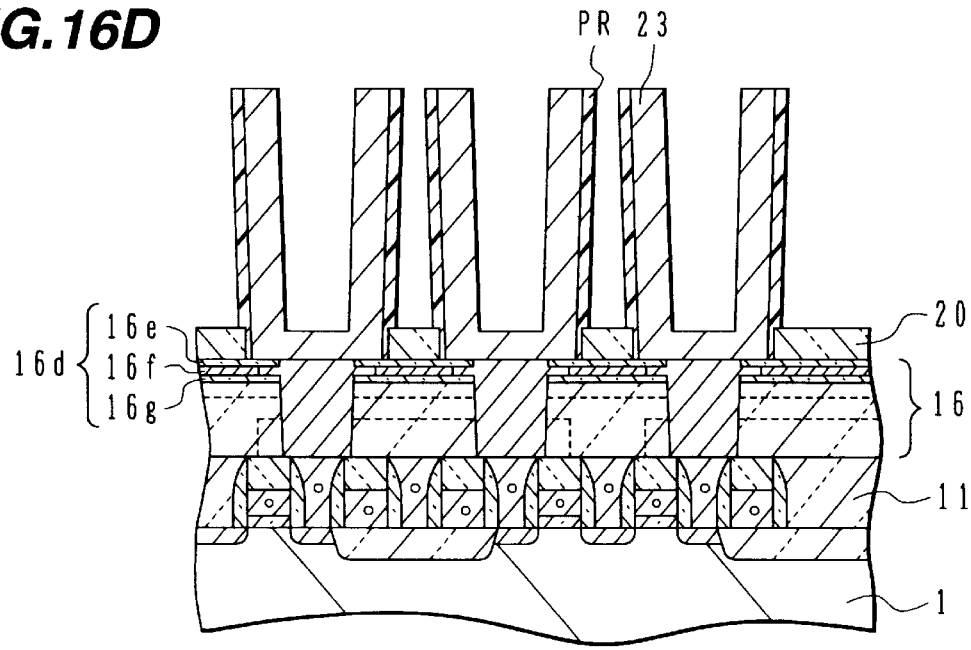

The processes of forming the storage electrode are illustrated in FIGS. 15E and 15F. A silicon nitride film 20 and a silicon oxide film 21 are formed over the whole substrate surface. The silicon nitride film 20 may be omitted. Openings AP12 are formed through the silicon nitride film 20 and silicon oxide film 21.

Storage electrode material such as Ru is deposited.

As shown in FIG. 15E, the storage electrode material Ru deposited on the silicon oxide film 21 is removed, and the inner protective film of SOG or the like is formed.

Ru and SOG are etched to depress them lower than the upper surface of the silicon oxide film 21.

Thereafter, the oxide film 21 between the storage electrodes 23 is selectively etched.

The capacitor dielectric film and cell plate electrodes are thereafter formed by the processes described earlier, e.g., by the processes of the first embodiment.

According to the semiconductor device and its manufacture method of this embodiment, the projection is formed projecting from the outer wall of the plug interconnecting the storage electrode and lower-level plug. This projection is inserted into the laterally extending slit formed in the middle film of the three-layer structure sandwiched between the upper and lower nitride films.

It is therefore possible to reliably prevent hydrofluoric acid based etchant from permeating the lower-level region.

In addition, the plug 17 is hard to be pulled out because its projection enters the laterally extending slit. Since the storage electrode is supported strongly, a fall of the storage electrode can be prevented.

Although the laterally extending slit HS is formed after the upper film 16e of the three-layer structure is etched, it may be formed after the three layers 16e, 16f and 16g are formed and an opening is completed.

In this case, however, the etch amount is required to be determined from permeation of hydrofluoric acid based etchant into the lower-level structure. From this viewpoint, the former process is preferable.

In the above embodiments, although the cylinder type storage electrode is used, other types such as a pillar type, a cylinder type with a waved large area surface, a pillar type with a waved large area surface may also be used.

The present invention has been described in connection with the preferred embodiments. The invention is not limited only to the above embodiments. It is apparent that various modifications, improvements, combinations, and the like can be made by those skilled in the art.

What we claim are:

1. A capacitor comprising:
   a substrate having a first area and a second area surrounding said first area;
   an electrode formed above a surface of said substrate in said first area and having a first height;
   an insulating film formed in said second area surrounding the first area, and having a second height larger than said first height;
   a dielectric film formed on said electrode; and
   an opposing electrode formed on said dielectric film,
   wherein a shape of a side wall of said insulating film includes a shape reflecting an outer peripheral shape of a side wall of said electrode facing the side wall of said insulating film.

2. The capacitor of claim 1, wherein said electrode has a cylindrical shape including inner and outer side walls, and said dielectric film and said opposing electrode cover both the inner and the outer side walls of said electrode.

3. A capacitor comprising:
   a substrate having a first area and a second area surrounding said first area;
   an electrode formed on a surface of said substrate in said first area and having a first height;
   an insulating film formed in said second area surrounding the first area, and having a second height larger than said first height;
   a dielectric film formed above said electrode;
   an opposing electrode formed on said dielectric film; and
   a residual portion of said insulating film formed in said first area and having a side wall shape reflecting a side wall shape of said electrode.

4. The capacitor of claim 3, wherein said electrode has a cylindrical shape including inner and outer side walls, and said dielectric film and said opposing electrode cover both the inner and the outer side walls of said electrode.

5. A semiconductor device comprising:
   a semiconductor substrate having a first area and a second area surrounding said first area;
   a first insulating film formed above said semiconductor substrate;
   a contact hole formed through said first insulating film in said first area;
   an electrode electrically connected to said semiconductor substrate via said contact hole having a first height;
   a second insulating film formed above said first insulating film in said second area surrounding the first area, and having a second height larger than said first height;
   a dielectric film formed on said electrodes; and
   an opposing electrode formed on said dielectric film,
   wherein a shape of a side wall of said second insulating film includes a shape reflecting an outer peripheral shape of a side wall of said electrode facing the side wall of said second insulating film.

6. A semiconductor device according to claim 5, wherein the side wall of said electrode is formed with a projection outward projecting from said side wall and a recess for accommodating said projection is formed in said first insulating film.

7. A semiconductor device according to claim 5, further comprising a third insulating film formed between said first and second insulating films, the side wall of said electrode is formed with a projection outward projecting from said side wall and a recess for accommodating said projection is formed in said first insulating film.

8. A semiconductor device according to claim 5, further comprising:

semiconductor memory y switching elements each including a gate, a source and a drain and formed in said first area, to constitute semiconductor memory elements with said electrode, said dielectric film and said opposing electrode; and peripheral circuit elements formed in said second a area.

9. The capacitor of claim 5, wherein said electrode has a cylindrical shape including inner and outer side walls, and said dielectric film and said opposing electrode cover both the inner and the outer side walls of said electrode.

10. A semiconductor device comprising:

a semiconductor substrate having a first area and a second area surrounding said first area;

a first insulating film formed above said semiconductor substrate;

a plurality of contact holes formed through said first insulating film in said first area;

a plurality of electrodes electrically connected to said semiconductor substrate via said plurality of contact holes and having a first height;

a second insulating film formed above said first insulating film in said second area surrounding the first area and having a second height larger than said first height;

a dielectric film formed on said electrodes;

an opposing electrode formed on said dielectric film; and a residual portion of said second insulating film formed in said first area and having a side wall shape reflecting a side wall shape of said electrode.

11. A semiconductor device according to claim 10, wherein the side wall of said electrode is formed with a projection outward projecting from said side wall and a recess for accommodating said projection is formed in said first insulating film.

12. A semiconductor device according to claim 10, further comprising a third insulating film formed between said first and second insulating films, the side wall of said electrode is formed with a projection outward projecting from said side wall and a recess for accommodating said projection is formed in said first insulating film.

13. A semiconductor device according to claim 10, further comprising:

semiconductor memory switching elements each including a gate, a source and a drain and formed in said first area, to constitute semiconductor memory elements with said electrodes, said dielectric film and said opposing electrode; and peripheral circuit elements formed in said second area.

14. The capacitor of claim 10, wherein said electrode has a cylindrical shape including inner and outer side walls, and said dielectric film and said opposing electrode cover both the inner and the outer side walls of said electrode.

* * * * *